US012327522B2

(12) United States Patent
Toyoda

(10) Patent No.: US 12,327,522 B2
(45) Date of Patent: Jun. 10, 2025

(54) DISPLAY DEVICE, DRIVE METHOD FOR DISPLAY DEVICE, AND ELECTRONIC DEVICE

(71) Applicant: SONY SEMICONDUCTOR SOLUTIONS CORPORATION, Kanagawa (JP)

(72) Inventor: Takashi Toyoda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/044,748

(22) PCT Filed: Sep. 10, 2021

(86) PCT No.: PCT/JP2021/033255
§ 371 (c)(1),
(2) Date: Mar. 9, 2023

(87) PCT Pub. No.: WO2022/059606
PCT Pub. Date: Mar. 24, 2022

(65) Prior Publication Data
US 2023/0368731 A1    Nov. 16, 2023

(30) Foreign Application Priority Data
Sep. 18, 2020    (JP) ................. 2020-157094

(51) Int. Cl.
G06F 3/038    (2013.01)
G09G 3/20    (2006.01)
(Continued)

(52) U.S. Cl.
CPC ......... *G09G 3/3233* (2013.01); *G09G 3/2096* (2013.01); *H10K 59/131* (2023.02);
(Continued)

(58) Field of Classification Search
CPC ... G09G 3/3233; G09G 3/2096; H10K 59/131
(Continued)

(56) References Cited

U.S. PATENT DOCUMENTS

2010/0141498 A1* 6/2010 Lee ..................... H03M 1/664
345/204
2014/0118409 A1* 5/2014 Jun ..................... G09G 3/3233
345/690
(Continued)

FOREIGN PATENT DOCUMENTS

JP    2007-534015 A    11/2007
JP    2009-116115 A    5/2009
(Continued)

OTHER PUBLICATIONS

International Search Report and Written Opinion of PCT Application No. PCT/JP2021/033255, issued on Nov. 9, 2021, 11 pages of ISRWO.

*Primary Examiner* — Jonathan M Blancha
(74) *Attorney, Agent, or Firm* — CHIP LAW GROUP

(57) ABSTRACT

Provided is a display device that includes a pixel array unit in which pixels are two-dimensionally arranged in a matrix shape, each of the pixels including a light emitting element, and a signal output unit that outputs, to each of the pixels of the pixel array unit, a signal voltage of a video signal and an initialization voltage for initializing a gate voltage of a driving transistor. The signal output unit varies the initialization voltage depending on the signal voltage of the video signal for each of the pixels to which the signal voltage of the video signal is written.

14 Claims, 16 Drawing Sheets

(51) Int. Cl.
    *G09G 3/3233*     (2016.01)
    *H10K 59/131*     (2023.01)

(52) U.S. Cl.
    CPC ............... *G09G 2300/0819* (2013.01); *G09G 2300/0852* (2013.01); *G09G 2300/0861* (2013.01); *G09G 2310/0259* (2013.01); *G09G 2310/08* (2013.01); *G09G 2320/045* (2013.01); *G09G 2320/0626* (2013.01); *G09G 2320/0673* (2013.01); *G09G 2330/021* (2013.01)

(58) Field of Classification Search
    USPC ......................................................... 345/212
    See application file for complete search history.

(56) References Cited

U.S. PATENT DOCUMENTS

2017/0186375 A1*   6/2017   Jung ..................... G09G 3/3233
2021/0183315 A1*   6/2021   Ka ........................ G09G 3/3233

FOREIGN PATENT DOCUMENTS

| JP | 2015-011267 A | 1/2015 |
| JP | 2015-034861 A | 2/2015 |
| JP | 2015-055837 A | 3/2015 |
| JP | 2018-041001 A | 3/2018 |
| JP | 2019-095692 A | 6/2019 |
| JP | 2019-101098 A | 6/2019 |

* cited by examiner

DISPLAY DEVICE, DRIVE METHOD FOR DISPLAY DEVICE, AND ELECTRONIC DEVICE

CROSS REFERENCE TO RELATED APPLICATIONS

This application is a U.S. National Phase of International Patent Application No. PCT/JP2021/033255 filed on Sep. 10, 2021, which claims priority benefit of Japanese Patent Application No. JP 2020-157094 filed in the Japan Patent Office on Sep. 18, 2020. Each of the above-referenced applications is hereby incorporated herein by reference in its entirety.

FIELD

The present disclosure relates to a display device, a drive method for the display device, and an electronic device.

BACKGROUND

In recent years, a flat-type (flat-panel-type) display devices have been the mainstream. As one of flat-type display devices, there is a display device using, as a light emitting element of a pixel, a so-called current-driven-type electro-optical element in which light emission luminance changes depending on a current value flowing through the device. Examples of the current-driven-type electro-optical element include an organic EL element using electroluminescence (EL) of organic materials and a phenomenon of emitting light when an electric field is applied to an organic thin film.

A flat-type display device such as an organic EL display device (see, for example, Patent Literature 1) using an organic EL element as a light emitting element (electro-optical element) of a pixel can be used for, for example, an electronic device such as a mobile device or a wearable device. Since these electronic devices use dry cells or a battery as the power source, it is demanded to reduce the power consumption. Therefore, in display devices such as organic EL display devices, reduction of the voltage of the main power supply is under way for the purpose of reducing the power consumption.

CITATION LIST

Patent Literature

Patent Literature 1: JP 2015-034861 A

SUMMARY

Technical Problem

As described above, when the voltage of the main power supply is reduced for the purpose of reducing the power consumption of a display device, there is a possibility that the amplitude of a video signal to be written into a pixel cannot be sufficiently secured and that the maximum luminance is limited by the amplitude of the video signal.

Therefore, an object of the present disclosure is to provide a display device capable of achieving high luminance even in a state where a video signal has a low amplitude, a drive method of the display device, and an electronic device having the display device.

Solution to Problem

A display device of the present disclosure in order to solve the above problem includes:
 a pixel array unit in which pixels are two-dimensionally arranged in a matrix shape, each of the pixels including a light emitting element and a driving transistor that drives the light emitting element; and
 a signal output unit that outputs, to each of the pixels of the pixel array unit, a signal voltage of a video signal and an initialization voltage for initializing a gate voltage of the driving transistor,
 wherein the signal output unit varies the initialization voltage depending on the signal voltage of the video signal for each of the pixels to which the signal voltage of the video signal is written.

A drive method of a display device of the present disclosure in order to solve the above problem includes:
 a pixel array unit in which pixels are two-dimensionally arranged in a matrix shape, each of the pixels including a light emitting element and a driving transistor that drives the light emitting element; and
 a signal output unit that outputs, to each of the pixels of the pixel array unit, a signal voltage of a video signal and an initialization voltage for initializing a gate voltage of the driving transistor, the drive method for driving the display device, comprising:
 varying the initialization voltage depending on the signal voltage of the video signal for each of the pixels to which the signal voltage of the video signal is written.

An electronic device of the present disclosure in order to solve the above problem includes:
 a pixel array unit in which pixels are two-dimensionally arranged in a matrix shape, each of the pixels including a light emitting element and a driving transistor that drives the light emitting element; and
 a signal output unit that outputs, to each of the pixels of the pixel array unit, a signal voltage of a video signal and an initialization voltage for initializing a gate voltage of the driving transistor,
 wherein the signal output unit varies the initialization voltage depending on the signal voltage of the video signal for each of the pixels to which the signal voltage of the video signal is written.

DESCRIPTION OF EMBODIMENTS

Figure 1:
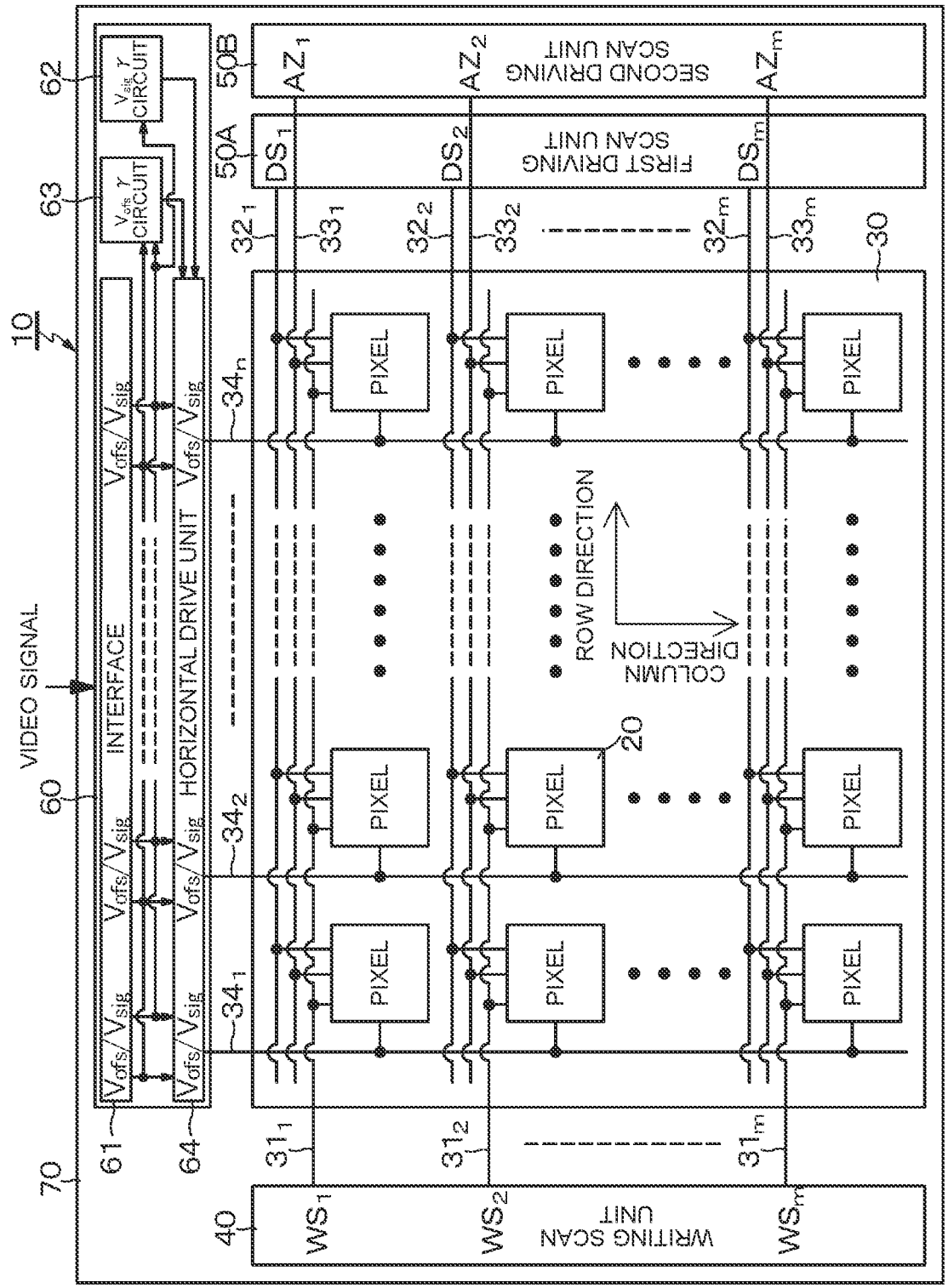
FIG. 1 is a system configuration diagram schematically illustrating an overview of a configuration of an organic EL display device according to an embodiment of the present disclosure.

Hereinafter, modes for carrying out the technology according to the present disclosure (hereinafter, referred to as "embodiments") will be described in detail with reference to the drawings. The technology according to the present disclosure is not limited to the embodiments. In the following description, the same symbols will be used for the same elements or elements having the same function, and redundant description will be omitted. Note that the description will be given in the following order.

1. Description in General on Display Device, Drive Method for Display Device, and Electronic Device of Present Disclosure
2. Organic EL Display Device According to Embodiment of Present Disclosure
2-1. System Configuration Example
2-2. Circuit Configuration Example of Pixel
2-3. Basic Circuit Operation
2-4. Another Circuit Configuration Example of Pixel
2-5. About Relationship Between Initialization Voltage $V_{ofs}$ and Each of Luminance and Correction Capability
2-6. Configuration Example of Signal Output Unit
2-6-1. First Example (Example of Generating Initialization Voltage $V_{ofs}$ Using Ladder Resistance Circuit)
2-6-2. Second Example (Modification of First Example: Example of Generating Initialization Voltage $V_{ofs}$ Also by Using $V_{sig}$ Ladder Resistance Circuit)
2-6-3. Third Example (Example of Generating Initialization Voltage $V_{ofs}$ Using Ramp Waveform)
3. Modification
4. Electronic Device of Present Disclosure (Example of Head-Mounted Display)
5. Possible Configurations of Present Disclosure <Description in General on Display Device, Drive Method for Display Device, and Electronic Device of Present Disclosure>

In a display device, a drive method thereof, and an electronic device of the present disclosure, a signal output unit can be configured such that a voltage between a gate electrode and a source electrode of a driving transistor is set relatively small in a relatively high luminance region or that a voltage between a gate electrode and a source electrode of a driving transistor is set relatively large in a luminance region having a luminance lower than that of the relatively high luminance region.

In the display device, the drive method of the display device, and the electronic device of the present disclosure including the above preferable configuration, in a case where the driving transistor includes a P-channel transistor, the signal output unit can be configured such that an initialization voltage is set relatively high in a relatively high luminance region or that the initialization voltage is set relatively low in a luminance region having a luminance lower than that of the relatively high luminance region.

Moreover, in the display device, the drive method of the display device, and the electronic device of the present disclosure including the above preferable configuration, it is possible to have a configuration having a threshold value correcting function of changing a source voltage of a driving transistor, with reference to the initialization voltage obtained by initializing a gate voltage of a driving transistor, toward a voltage obtained by subtracting a threshold voltage of the driving transistor from the initialization voltage.

Furthermore, in the display device, the drive method of the display device, and the electronic device of the present disclosure including the above preferable configuration, the signal output unit may include a first gamma circuit that performs gamma correction on a signal voltage of a video signal and determines signal voltages corresponding to gradation and may further include a second gamma circuit that performs gamma correction on the initialization voltage on the basis of the signal voltages of the video signal and determines initialization voltages corresponding to the gradation.

In addition, in the display device, the drive method of the display device, and the electronic device of the present disclosure including the above preferable configuration, the first gamma circuit can include a ladder resistance circuit to generate signal voltages corresponding to the gradation of the video signal and the second gamma circuit can include a ladder resistance circuit to generate initialization voltages corresponding to the gradation of the video signal. Alternatively, the second gamma circuit can be configured to generate the initialization voltages corresponding to the gradation of the video signal using the first gamma circuit including the ladder resistance circuit.

In addition, in the display device, the drive method of the display device, and the electronic device of the present disclosure including the above preferable configuration, the first gamma circuit can include a ramp wave generating circuit that generates a ramp waveform whose potential varies uniformly. In this case, it is possible to include a switch unit that samples the ramp waveform at timing corresponding to gradation to be written in pixels and determines signal voltages to be written in the pixels and to also generate initialization voltages corresponding to the gradation of the video signal by using the ramp waveform. The ramp wave generating circuit can include a digital-analog conversion circuit.

In addition, in the display device, the drive method of the display device, and the electronic device of the present disclosure including the above preferable configuration, a light emitting element may include a current-driven-type electro-optical element in which light emission luminance changes depending on a current value flowing through the device, and the current-driven-type electro-optical element may include an organic electroluminescence element.

<Organic EL Display Device According to Embodiment of Present Disclosure>

A display device according to an embodiment of the present disclosure is an active matrix-type display device that controls a current flowing through an electro-optical element by an active element included in a pixel including the electro-optical element, for example, an insulated gate field effect transistor. Examples of an insulated gate field effect transistor include, typically, a metal oxide semiconductor (MOS) transistor or a thin film transistor (TFT). Here, as an example, an organic EL display device will be described which uses, as a light emitting element of a pixel, for example, an organic EL element which is a current-driven electro-optical element whose light emission luminance varies depending on a current value flowing through the device.

[System Configuration Example]

FIG. 1 is a system configuration diagram schematically illustrating an overview of a configuration of an organic EL display device according to an embodiment of the present disclosure.

As illustrated in FIG. 1, an organic EL display device 10 according to the present embodiment includes a pixel array unit 30 in which a plurality of pixels 20 including organic EL elements is two-dimensionally arranged in a matrix shape and a peripheral circuit unit disposed around the pixel array unit 30. The peripheral circuit unit includes, for example, a writing scan unit 40, a first driving scan unit 50A, a second driving scan unit 50B, a signal output unit 60, and the like mounted on a same display panel 70 as the pixel array unit 30 and drives the pixels 20 of the pixel array unit 30. Incidentally, some or all of the writing scan unit 40, the first driving scan unit 50A, the second driving scan unit 50B, and the signal output unit 60 may be provided outside the display panel 70.

The organic EL display device 10 can be configured to support monochrome (black-and-white) display or color display. In a case where the organic EL display device 10 supports color display, one pixel (unit pixel) as a unit for forming a color image includes a plurality of sub-pixels. In this case, each of the sub-pixels corresponds to a pixel 20 in FIG. 1. More specifically, in a display device supporting color display, one pixel includes, for example, three sub-pixels including a sub-pixel that emits red (R) light, a sub-pixel that emits green (G) light, and a sub-pixel that emits blue (B) light.

However, one pixel is not limited to the combination of sub-pixels of the three primary colors of RGB, and one pixel can be figured by further adding sub-pixels of one color or a plurality of colors to the sub-pixels of the three primary colors. More specifically, for example, one pixel can be configured by adding a sub-pixel that emits white (W) light for improving the luminance, or one pixel can be configured by adding at least one sub-pixel that emits complementary color light in order to expand the color reproduction range.

In the pixel array unit 30, scanning lines 31 ($31_1$ to $31_m$), first drive lines 32 ($32_1$ to $32_m$), and second drive lines 33 ($33_1$ to $33_m$) are wired for respective pixel rows along a row direction (direction of array of pixels of a pixel row) with respect to the array of pixels 20 of m rows and n columns. Furthermore, signal lines 34 ($34_1$ to $34_n$) are wired for the respective pixel columns along the column direction (direction of array of pixels of a pixel column) with respect to the array of the pixels 20 of m rows and n columns.

The scanning lines $31_1$ to $31_m$ are connected to respective output ends of corresponding rows of the writing scan unit 40. The first drive lines $32_1$ to $32_m$ are connected to respective output ends of corresponding rows of the first driving scan unit 50A. The second drive lined $33_1$ to $33_m$ are connected to respective output ends of corresponding rows of the second driving scan unit 50B. The signal lines $34_1$ to $34_n$ are connected to respective output ends of corresponding columns of the signal output unit 60.

The writing scan unit 40 includes a shift register circuit and others. The writing scan unit 40 performs so-called line sequential scanning, in which, for writing signal voltages of video signals to the pixels 20 of the pixel array unit 30, the pixels 20 of the pixel array unit 30 are sequentially scanned row by row by sequentially supplying writing scan signals WS ($WS_1$ to $WS_m$) to the scanning lines 31 ($31_1$ to $31_m$).

Similarly to the writing scan unit 40, the first driving scan unit 50A includes a shift register circuit and others. The first driving scan unit 50A controls light emission and no light emission (extinction) of the pixels 20 by supplying light emission control signals DS ($DS_1$ to $DS_m$) to the first drive lines 32 ($32_1$ to $32_m$) in synchronization with the line sequential scanning by the writing scan unit 40.

Similarly to the writing scan unit 40, the second driving scan unit 50B includes a shift register circuit and others. The second driving scan unit 50B performs control so that the pixels 20 do not emit light in a non-light emitting period by supplying auto-zero signals AZ ($AZ_1$ to $AZ_m$) to the second drive lines 33 ($33_1$ to $33_m$) in synchronization with the line sequential scanning by the writing scan unit 40.

The signal output unit 60 alternatively outputs, to the signal lines 34 ($34_1$ to $34_n$), a signal voltage $V_{sig}$ of a video signal corresponding to luminance information (hereinafter, it may be simply referred to as the "signal voltage") supplied from an external signal supply source (not illustrated) and an initialization voltage $V_{ofs}$ for initializing a gate voltage of a driving transistor $Tr_1$ described later.

In organic EL display devices of the related art, an initialization voltage $V_{ofs}$ is set to a fixed voltage, for example, a voltage corresponding to a black level of the video signal or a voltage close to this voltage. On the other hand, in the organic EL display device 10 according to the present embodiment, the initialization voltage $V_{ofs}$ is variable. Specifically, the signal output unit 60 modifies the initialization voltage $V_{ofs}$ depending on the signal voltage $V_{sig}$ of the video signal for each pixel to which the signal voltage $V_{sig}$ of the video signal is written.

Details of the signal output unit 60 that alternatively outputs the signal voltage $V_{sig}$ of the video signal and the initialization voltage $V_{ofs}$, which is variable depending on the signal voltage $V_{sig}$, will be described later.

The signal voltage $V_{sig}$ and the initialization voltage $V_{ofs}$ alternatively output from the signal output unit 60 is written to the pixels 20 of the pixel array unit 30 via the signal lines 34 ($34_1$ to $34_n$) by each pixel row selected by the line sequential scanning by the writing scan unit 40. That is, the signal output unit 60 adopts a drive mode of line sequential writing in which the signal voltage $V_{sig}$ is written by each pixel row (line).

[Circuit Configuration Example of Pixel]

Figure 2:
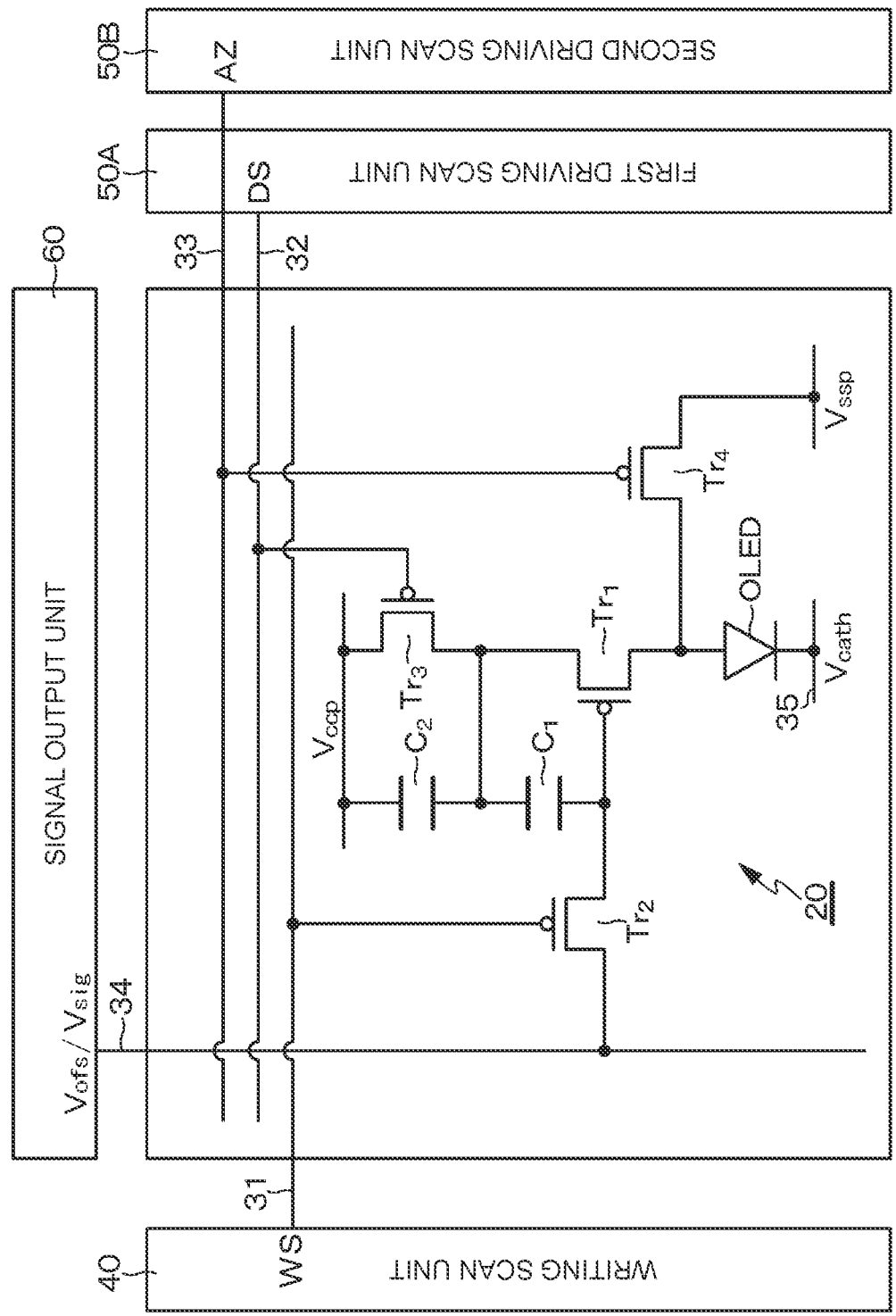
FIG. 2 is a circuit diagram illustrating an example of a circuit configuration of a pixel in the organic EL display device according to the embodiment of the present disclosure.

As illustrated in FIG. 2, a pixel 20 includes an organic EL element OLED and a drive circuit unit that drives the organic EL element OLED by applying a current to the organic EL element OLED. In the organic EL element OLED, a cathode electrode is connected to a shared power supply line 35 wired in a shared manner by all the pixels 20.

The drive circuit unit that drives the organic EL element OLED has a configuration of four transistors (4Tr) and two capacitive elements (2C) including the driving transistor $Tr_1$, a writing transistor (sampling transistor) $Tr_2$, a light emission controlling transistor $Tr_3$, a switching transistor $Tr_4$, a holding capacitor $C_1$, and an auxiliary capacitor $C_2$. Note that, in the present example, a pixel 20 is formed not on an insulator such as a glass substrate but on a semiconductor substrate such as a silicon substrate. The driving transistor $Tr_1$ includes a P-channel transistor.

Furthermore, in the present circuit configuration example, the writing transistor $Tr_2$, the light emission controlling transistor $Tr_3$, and the switching transistor $Tr_4$ also include a P-channel transistor similarly to the driving transistor $Tr_1$. Therefore, the driving transistor $Tr_1$, the writing transistor $Tr_2$, the light emission controlling transistor $Tr_3$, and the switching transistor $Tr_4$ do not have a three-terminal configuration of a source, a gate, and a drain but have a four-terminal configuration of a source, a gate, a drain, and a back gate.

In the pixel 20 having the above configuration, a drain electrode of the writing transistor $Tr_2$ is connected to an anode electrode of the organic EL element OLED. That is, the writing transistor $Tr_2$ is connected in series to the organic EL element OLED and drives the organic EL element OLED in response to the signal voltage $V_{sig}$ of the video signal supplied from the signal output unit 60 through a signal line 34.

The writing transistor $Tr_2$ is connected between the signal line 34 and a gate electrode of the driving transistor $Tr_1$ and, by sampling the signal voltage $V_{sig}$ of the video signal or the initialization voltage $V_{ofs}$ supplied from the signal output unit 60 through the signal line 34, writes the signal voltage $V_{sig}$ or the initialization voltage $V_{ofs}$ to the gate electrode of the driving transistor $Tr_1$. By writing the initialization voltage $V_{ofs}$, a gate voltage $V_g$ of the driving transistor $Tr_1$ is initialized.

The light emission controlling transistor $Tr_3$ is connected between a power supply line of a high-potential-side power supply voltage $V_{ccp}$ and a source electrode of the driving transistor $Tr_1$ and controls light emission and no light emission of the organic EL element OLED by being driven by the light emission control signal DS applied to a gate electrode from the first driving scan unit 50A through the first drive line 32.

The switching transistor $Tr_4$ is connected between a drain electrode of the driving transistor $Tr_1$ and a current discharge destination node (for example, a power supply line of a low-potential-side power supply voltage $V_{ssp}$) and performs control so that the organic EL element OLED does not emit light during a non-light emitting period of the organic EL element OLED by being driven by the auto-zero signal AZ applied from the second driving scan unit 50B to a gate electrode through the second drive line 33.

The holding capacitor $C_1$ is connected between the gate electrode and a source electrode of the driving transistor $Tr_1$ and holds the signal voltage $V_{sig}$ written by sampling by the writing transistor $Tr_2$. The driving transistor $Tr_1$ drives the organic EL element OLED by causing a drive current corresponding to the holding voltage of the holding capacitor $C_1$ to flow through the organic EL element OLED.

The auxiliary capacitor $C_2$ is connected between the source electrode of the driving transistor $Tr_1$ and a node (for example, the power supply line of the high-potential-side power supply voltage $V_{ccp}$) of a fixed potential. The auxiliary capacitor $C_2$ exerts an action of suppressing fluctuation of a source voltage of the driving transistor $Tr_1$ when the signal voltage $V_{sig}$ of the video signal is written and an action of setting a voltage $V_{gs}$ between the gate electrode and the source electrode of the driving transistor $Tr_1$ to a threshold voltage $V_{th}$ of the driving transistor $Tr_1$.

[Basic Circuit Operation]

The basic circuit operation of the organic EL display device 10 having the above configuration will be described with reference to a timing waveform chart of FIG. 3.

Figure 3:
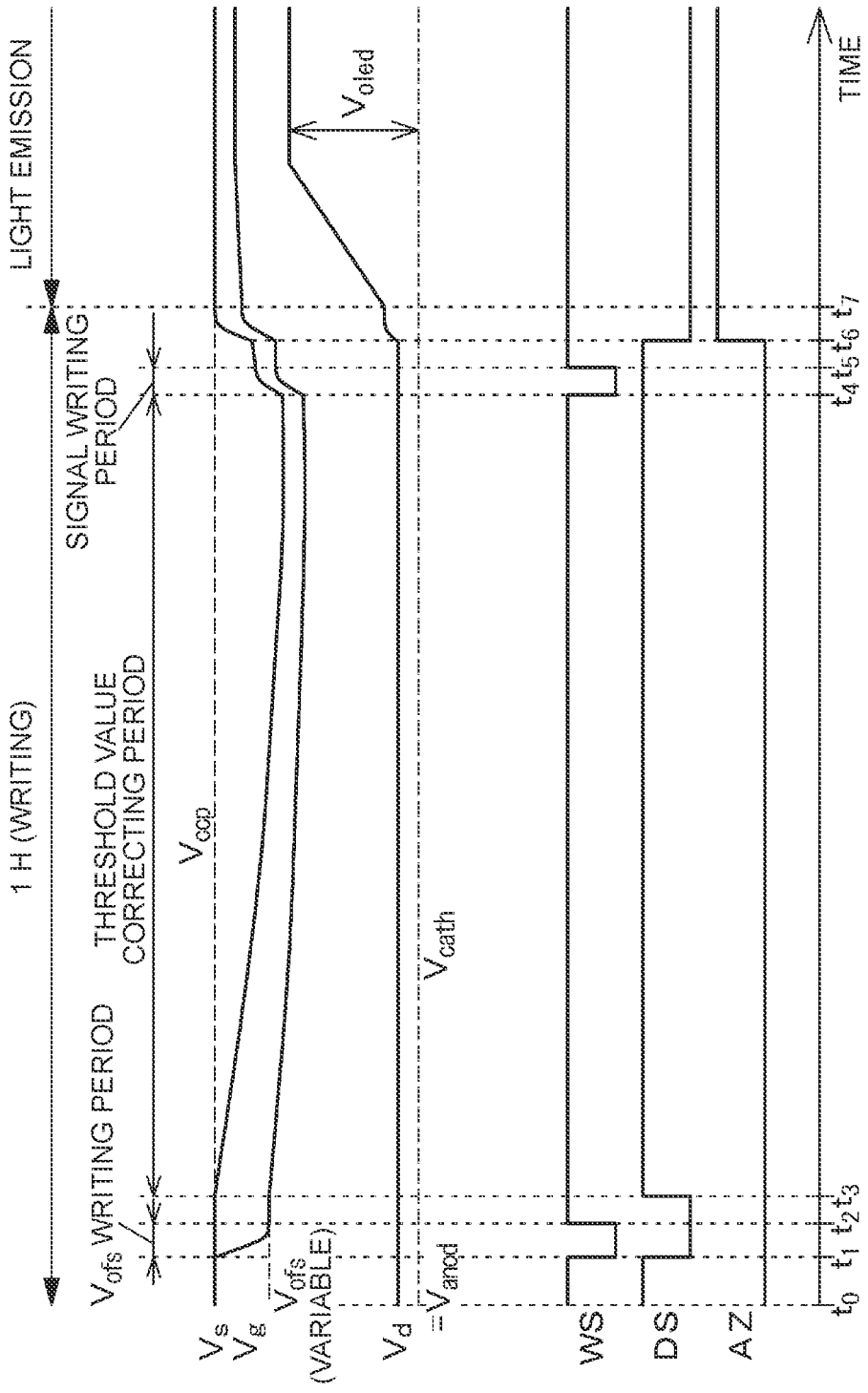
FIG. 3 is a timing waveform chart for explaining the basic operation of the organic EL display device according to the embodiment of the present disclosure.

Illustrated in the timing waveform chart of FIG. 3 are the states of changes of a source voltage $V_s$, the gate voltage $V_g$, and a drain voltage $V_d$ (=anode voltage $V_{anod}$ of the organic EL element OLED) of the driving transistor $Tr_1$, the writing scan signal WS, the light emission control signal DS, and the auto-zero signal AZ.

Since the writing transistor $Tr_2$, the light emission controlling transistor $Tr_3$, and the switching transistor $Tr_4$ are P-channel transistors, the low level states of the writing scan signal WS, the light emission control signal DS, and the auto-zero signal AZ give an active state, and the high level states thereof give an inactive state. Moreover, the writing transistor $Tr_2$, the light emission controlling transistor $Tr_3$, and the switching transistor $Tr_4$ are in a conductive state when the writing scan signal WS, the light emission control signal DS, and the auto-zero signal AZ are in the active state, and the writing transistor $Tr_2$, the light emission controlling transistor $Tr_3$, and the switching transistor $Tr_4$ are in a non-conductive state when the writing scan signal WS, the light emission control signal DS, and the auto-zero signal AZ are in the inactive state.

At time $t_1$, the writing scan signal WS transitions from a high level to a low level, whereby the writing transistor $Tr_2$ enters the conductive state. At this point, the initialization voltage $V_{ofs}$ for initializing the gate voltage of the driving transistor $Tr_1$ is output from the signal output unit 60 to the signal line 34. Therefore, the initialization voltage $V_{ofs}$ is written to the gate electrode of the driving transistor $Tr_1$ by sampling by the writing transistor $Tr_2$, and thus, the gate voltage $V_g$ of the driving transistor $Tr_1$ is initialized to $V_{ofs}$.

Furthermore, at time $t_1$, the light emission control signal DS also transitions from the high level to the low level, and thus the light emission controlling transistor $Tr_3$ enters the conductive state. Therefore, the source voltage $V_s$ of the driving transistor $Tr_1$ becomes the power supply voltage $V_{ccp}$. At this point, a voltage between the gate electrode and the source electrode of the driving transistor $Tr_1$ (hereinafter, it may be referred to as "gate-source voltage $V_{gs}$") is given by $V_{gs} = V_{ofs} - V_{ccp}$.

Incidentally, in order to execute threshold value correction operation (threshold value correction processing) of correcting the variation of the threshold voltage $V_{th}$ of the driving transistor $Tr_1$ among the pixels 20, it is preferable to set the gate-source voltage $V_{gs}$ of the driving transistor $Tr_1$ to a predetermined voltage value.

As the above, the initialization operation of setting (initializing) the gate voltage $V_g$ of the driving transistor $Tr_1$ to the initialization voltage $V_{ofs}$ and setting the source voltage $V_s$ of the driving transistor $Tr_1$ to the power supply voltage $V_{ccp}$ is the operation of preparation (threshold value correction preparation) before next threshold value correction operation is performed. Therefore, the initialization voltage $V_{ofs}$ and the power supply voltage $V_{ccp}$ are the initialization voltages of the gate voltage $V_g$ and the source voltage $V_s$ of the driving transistor $Tr_1$, respectively.

Next, at time $t_2$, the writing scan signal WS transitions from the low level to the high level, and the writing transistor $Tr_2$ enters the non-conductive state, whereby the writing of the initialization voltage $V_{ofs}$ ends. Next, at time $t_3$, when the light emission control signal DS transitions from the low level to the high level and the light emission controlling transistor $Tr_3$ enters the non-conductive state, the source electrode of the driving transistor $Tr_1$ enters a floating state, and the threshold value correction operation is started in a state where the gate voltage $V_g$ of the driving transistor $Tr_1$ is maintained at the initialization voltage $V_{ofs}$. That is, the source voltage $V_s$ of the driving transistor $Tr_1$ starts to fall (decrease) toward a voltage obtained by subtracting the threshold voltage $V_{th}$ from the gate voltage $V_g$ ($V_g - V_{th}$) of the driving transistor $Tr_1$.

Here, the initialization voltage $V_{ofs}$ output from the signal output unit 60 to the signal line 34 and written to the gate electrode of the driving transistor $Tr_1$ via the writing transistor $Tr_2$ is variable depending on the signal voltage $V_{sig}$ of the video signal. Moreover, the operation of varying the source voltage $V_s$ of the driving transistor $Tr_1$ toward the voltage ($V_g - V_{th}$) obtained by subtracting the threshold voltage $V_{th}$ of the driving transistor $Tr_1$ from the initialization voltage $V_{ofs}$ with reference to the initialization voltage $V_{ofs}$ of the gate voltage $V_g$ of the driving transistor $Tr_1$ serves as the threshold value correction operation. That is, the organic EL display device 10 according to the present embodiment has the threshold value correcting function of correcting the variation of the threshold voltage $V_{th}$ of the driving transistor $Tr_1$ among the pixels 20.

As the threshold value correction operation proceeds, the gate-source voltage $V_{gs}$ of the driving transistor $Tr_1$ eventually converges to the threshold voltage $V_{th}$ of the driving transistor $Tr_1$. The voltage corresponding to the threshold voltage $V_{th}$ is held in the holding capacitor $C_1$.

At time $t_4$, the writing scan signal WS transitions from the high level to the low level again, whereby the writing transistor $Tr_2$ enters the conductive state. At this point, the signal voltage $V_{sig}$ of the video signal is output from the signal output unit 60 to the signal line 34 instead of the initialization voltage $V_{ofs}$. Then, the signal voltage $V_{sig}$ of the video signal is written into the pixel 20 by the writing transistor $Tr_2$. By the writing operation of the signal voltage $V_{sig}$ by the writing transistor $Tr_2$, the gate voltage $V_g$ of the driving transistor $Tr_1$ becomes the signal voltage $V_{sig}$.

When the signal voltage $V_{sig}$ of the video signal is written, the auxiliary capacitor $C_2$ connected between the source electrode of the driving transistor $Tr_1$ and the power supply line of the power supply voltage $V_{ccp}$ exerts an action of suppressing fluctuation of the source voltage $V_s$ of the driving transistor $Tr_1$. Then, when the driving transistor $Tr_1$ is driven by the signal voltage $V_{sig}$ of the video signal, the threshold voltage $V_{th}$ of the driving transistor $Tr_1$ is canceled out by the voltage corresponding to the threshold voltage $V_{th}$ held in the holding capacitor $C_1$.

Next, at time $t_5$, the writing scan signal WS transitions from the low level to the high level, and the writing transistor $Tr_2$ enters the non-conductive state, whereby the writing period of the signal voltage $V_{sig}$ of the video signal ends. Then, at time $t_6$, the light emission control signal DS transitions from the high level to the low level, whereby the light emission controlling transistor $Tr_3$ enters the conductive state. As a result, a current is supplied from the power supply line of the power supply voltage $V_{ccp}$ to the driving transistor $Tr_1$ through the light emission controlling transistor $Tr_3$.

At this point, since the writing transistor $Tr_2$ is in the non-conductive state, the gate electrode of the driving transistor $Tr_1$ is electrically disconnected from the signal line 34 and is in the floating state. Incidentally, when the gate electrode of the driving transistor $Tr_1$ is in the floating state, since the holding capacitor $C_1$ is connected between the gate and the source of the driving transistor $Tr_1$, the gate voltage $V_g$ also fluctuates in conjunction with the fluctuation of the source voltage $V_s$ of the driving transistor $Tr_1$.

The operation in which the gate voltage $V_g$ of the driving transistor $Tr_1$ fluctuates in conjunction with the fluctuation of the source voltage $V_s$ as described above is bootstrap operation. In other words, the bootstrap operation is operation in which the gate voltage $V_g$ and the source voltage $V_s$ of the driving transistor $Tr_1$ fluctuate due to the holding capacitor $C_1$.

Then, when a drain-source current $I_{ds}$ of the driving transistor $Tr_1$ starts to flow to the organic EL element OLED, the anode voltage $V_{anod}$ of the organic EL element OLED increases depending on the current $I_{ds}$. Eventually, when the anode voltage $V_{anod}$ of the organic EL element OLED exceeds a threshold voltage $V_{thel}$ of the organic EL element OLED (time $t_7$), a drive current starts to flow through the organic EL element OLED, and thus the organic EL element OLED starts emitting light.

On the other hand, the auto-zero signal AZ is in the active state, for example, during a period until time $t_6$ when the light emission control signal DS transitions from the high level to the low level, and thus the switching transistor $Tr_4$ is in the conductive state. With the switching transistor $Tr_4$ being in the conductive state, the drain electrode of the driving transistor $Tr_1$ (anode electrode of the organic EL element OLED) and the current discharge destination node (for example, a low-potential-side power supply $V_{ssp}$) are electrically short-circuited via the switching transistor $Tr_4$.

Note that the on-resistance of the switching transistor $Tr_4$ is much smaller than that of the organic EL element OLED. Therefore, in the non-light emitting period of the organic EL element OLED, the current flowing through the driving transistor $Tr_1$ can be forcibly caused to flow into the current discharge destination node and be prevented from flowing into the organic EL element OLED. Incidentally, the auto-zero signal AZ is in an active state in 1 H in which threshold value correction and signal writing are performed, but the auto-zero signal is in an inactive state in the subsequent light emitting period.

By the action of the switching transistor $Tr_4$ described above, it is possible to prevent the current flowing through the driving transistor $Tr_1$ from flowing into the organic EL element OLED in the non-light emitting period of the organic EL element OLED. Consequently, the organic EL element OLED can be prevented from emitting light in the non-light emitting period, and thus the contrast of the display panel 70 can be enhanced as compared with a pixel configuration without the switching transistor $Tr_4$.

In the series of basic circuit operations described above, the operations of the preparation for the threshold value correction, the threshold value correction, and writing (signal writing) the signal voltage $V_{sig}$ of the video signal are executed, for example, in one horizontal period (1 H).

[Another Circuit Configuration Example of Pixel]

Figure 4A:
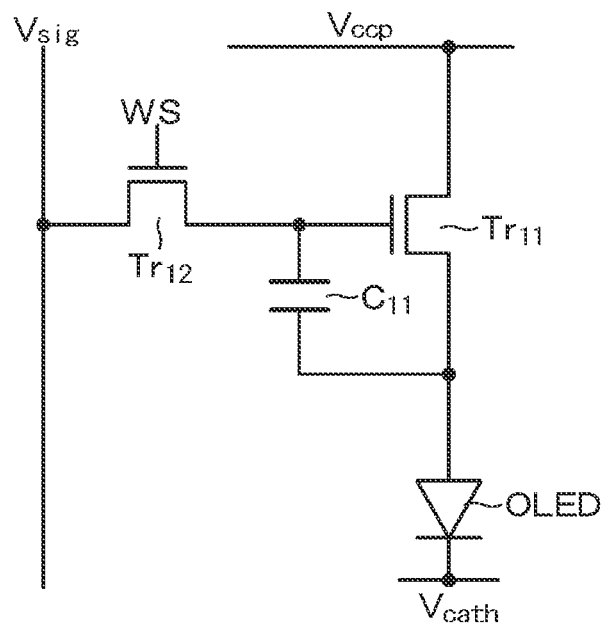
FIG. 4A is a circuit diagram schematically illustrating another circuit configuration example of a pixel.

Regarding the circuit configuration of a pixel 20, the circuit configuration illustrated in FIG. 2 is one example, and it is not limited to this circuit configuration example. For example, as illustrated in FIG. 4A, a circuit configuration including two N-channel transistors $Tr_{11}$ and $T_{12}$ and one capacitive element $C_{11}$ may be adopted. In the case of this circuit configuration, light emission and non-light emission of an organic EL element OLED can be controlled by pulsing a high-potential-side power supply voltage $V_{DD}$ that causes a drive current to flow through the organic EL element OLED and controlling the voltage value of the power supply voltage $V_{DD}$.

Figure 4B:
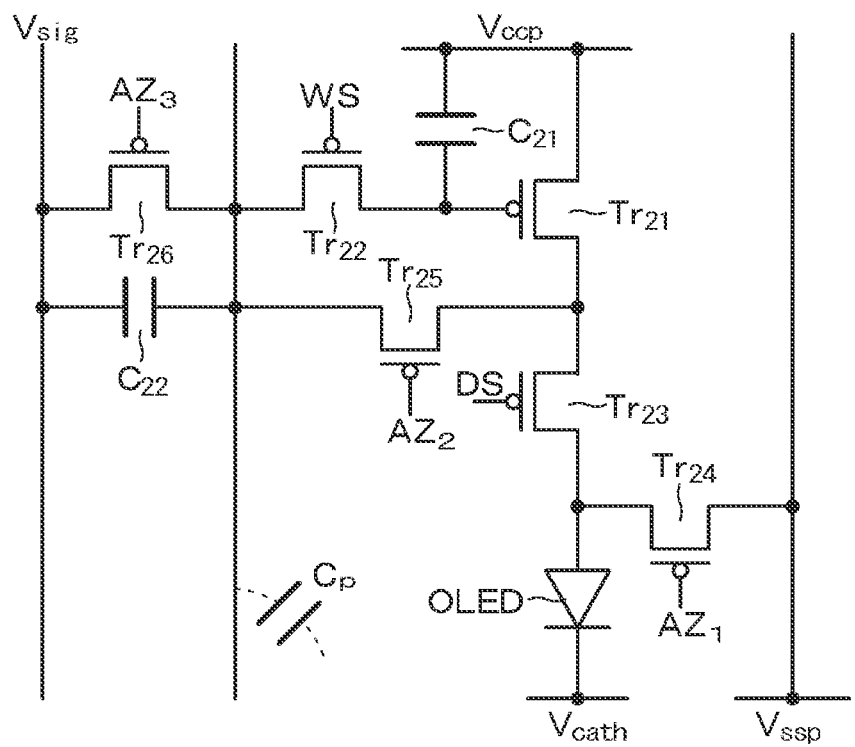
FIG. 4B is a circuit diagram schematically illustrating another circuit configuration example of a pixel.
Figure 5A:
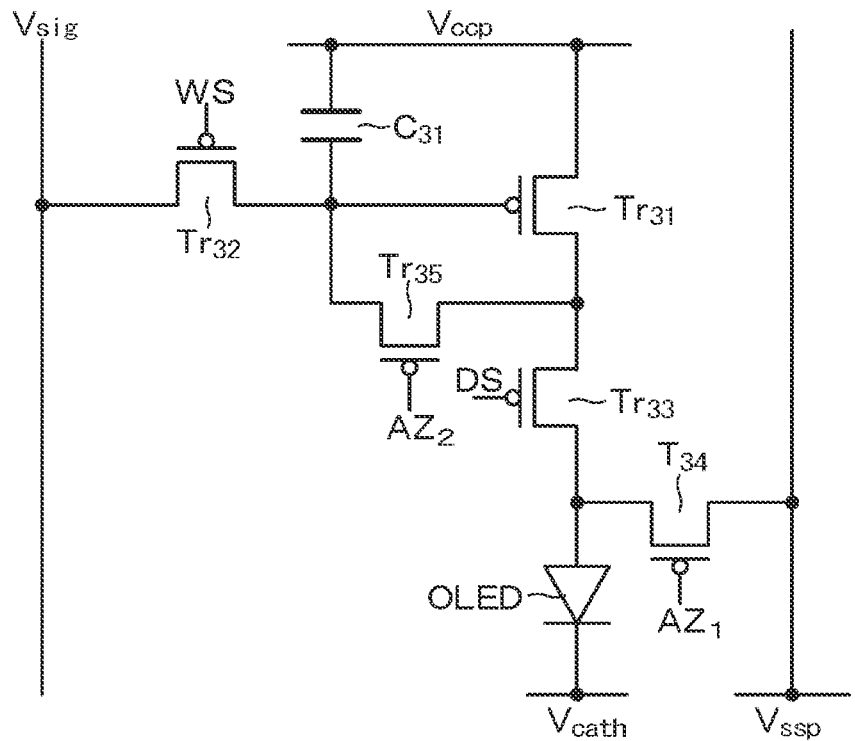
FIG. 5A is a circuit diagram schematically illustrating still another circuit configuration example of a pixel.
Figure 5B:
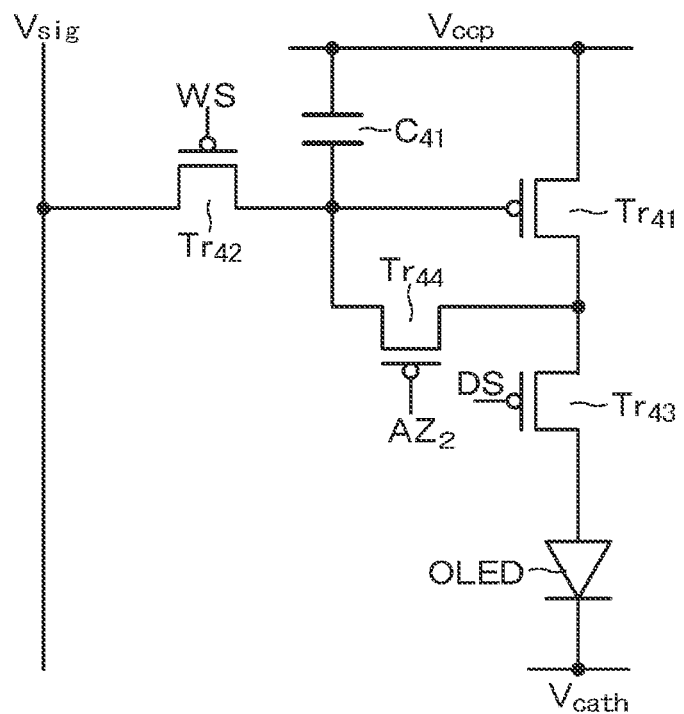
FIG. 5B is a circuit diagram schematically illustrating yet another circuit configuration example of a pixel.

Furthermore, as illustrated in FIG. 4B, a circuit configuration including six P-channel transistors $T_{21}$ to $T_{26}$ and two capacitive elements $C_{21}$ and $C_{22}$, a circuit configuration including five P-channel transistors $T_{31}$ to $T_{25}$ and one capacitive element $C_{31}$ as illustrated in FIG. 5A, or a circuit configuration including four P-channel transistors $T_{41}$ to $T_{44}$ and one capacitive element $C_{41}$ as illustrated in FIG. 5B may be adopted.

Note that, as other circuit configuration examples of a pixel 20, the four exemplary circuit configurations have been described. However, other circuit configurations of a pixel 20 is not limited to the four exemplary circuit configurations.

[About Relationship Between Initialization Voltage $V_{ofs}$ and Each of Luminance and Correction Capability]

In organic EL display devices of the related art, an initialization voltage $V_{ofs}$ is a fixed voltage. Here, the relationship between the initialization voltage $V_{ofs}$ and each of the luminance and the correction capability will be described. The correction capability is a correction capability of the threshold value correction described above.

Figure 6A:
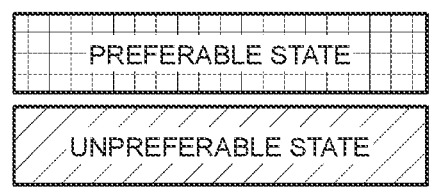
FIG. 6A is an explanatory diagram of a relationship between an initialization voltage $V_{ofs}$ and the luminance.

The relationship between the initialization voltage $V_{ofs}$ and the luminance is illustrated in FIG. 6A. It is known that in a case where the initialization voltage $V_{ofs}$ is relatively low, that is, in a case where the initial gate-source voltage $V_{gs}$ of the driving transistor $Tr_1$ is large, the luminance is relatively dark even when the same signal voltage $V_{sig}$ is written. Conversely, in a case where the initialization voltage $V_{ofs}$ is relatively high, that is, in a case where the initial gate-source voltage $V_{gs}$ of the driving transistor $Tr_1$ is small, the luminance is relatively bright even when the same signal voltage $V_{sig}$ is written. However, in a case where the initialization voltage $V_{ofs}$ is relatively high, even when the luminance is relatively bright, a case of COMPLETELY WHITE is in a preferable brightness state, whereas a case of COMPLETELY BLACK is in an unpreferable brightness state.

Figure 6B:
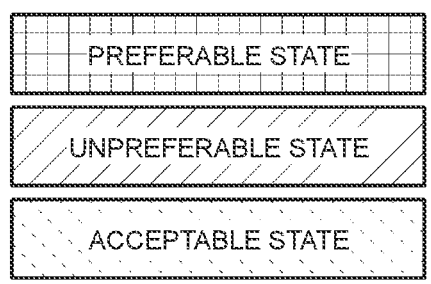
FIG. 6B is an explanatory diagram of a relationship between the initialization voltage $V_{ofs}$ and correction capability.

The relationship between the initialization voltage $V_{ofs}$ and the correction capability is illustrated in FIG. 6B. It is known that in a case where the initialization voltage $V_{ofs}$ is relatively low, the correction capability is relatively high over COMPLETELY BLACK to COMPLETELY WHITE and that, in a case where the initialization voltage $V_{ofs}$ is relatively high, the correction capability is relatively low over COMPLETELY BLACK to COMPLETELY WHITE. In particular, in a case where the initialization voltage $V_{ofs}$ is relatively high, the correction capability is low but acceptable for COMPLETELY BLACK, BRIGHT in the INTERMEDIATE TONE, and COMPLETELY WHITE, whereas the correction capability is in the unpreferable state for DARK in the INTERMEDIATE TONE.

As is apparent from the relationship between the initialization voltage $V_{ofs}$ and the luminance and the relationship between the initialization voltage $V_{ofs}$ and the correction capability described above, it is clear that in a state where the initialization voltage $V_{ofs}$ is relatively high, the luminance is bright, whereas the correction capability of the threshold value correction is low, and that conversely, in a state where the initialization voltage $V_{ofs}$ is relatively low, the luminance is dark, whereas the correction capability of the threshold value correction is high. The influence of the correction capability appears in the roughness (so-called surface roughness) on a display screen.

[Configuration Example of Signal Output Unit]

In view of the relationship between the initialization voltage $V_{ofs}$ and the luminance and the relationship between the initialization voltage $V_{ofs}$ and the correction capability described above, in the organic EL display device 10 according to the embodiment, the initialization voltage $V_{ofs}$ is variable contrary to the organic EL display devices of the related art in which the initialization voltage $V_{ofs}$ is fixed. Specifically, the signal output unit 60 in the organic EL display device 10 according to the present embodiment modifies the initialization voltage $V_{ofs}$ depending on the signal voltage $V_{sig}$ of the video signal for each pixel to which the signal voltage $V_{sig}$ of the video signal is written.

Figure 7A:
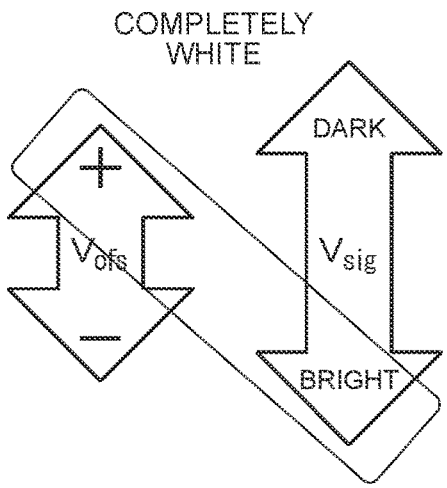
FIG. 7A is an explanatory diagram of a specific example of changing the initialization voltage depending on a signal voltage of a video signal.
Figure 8:
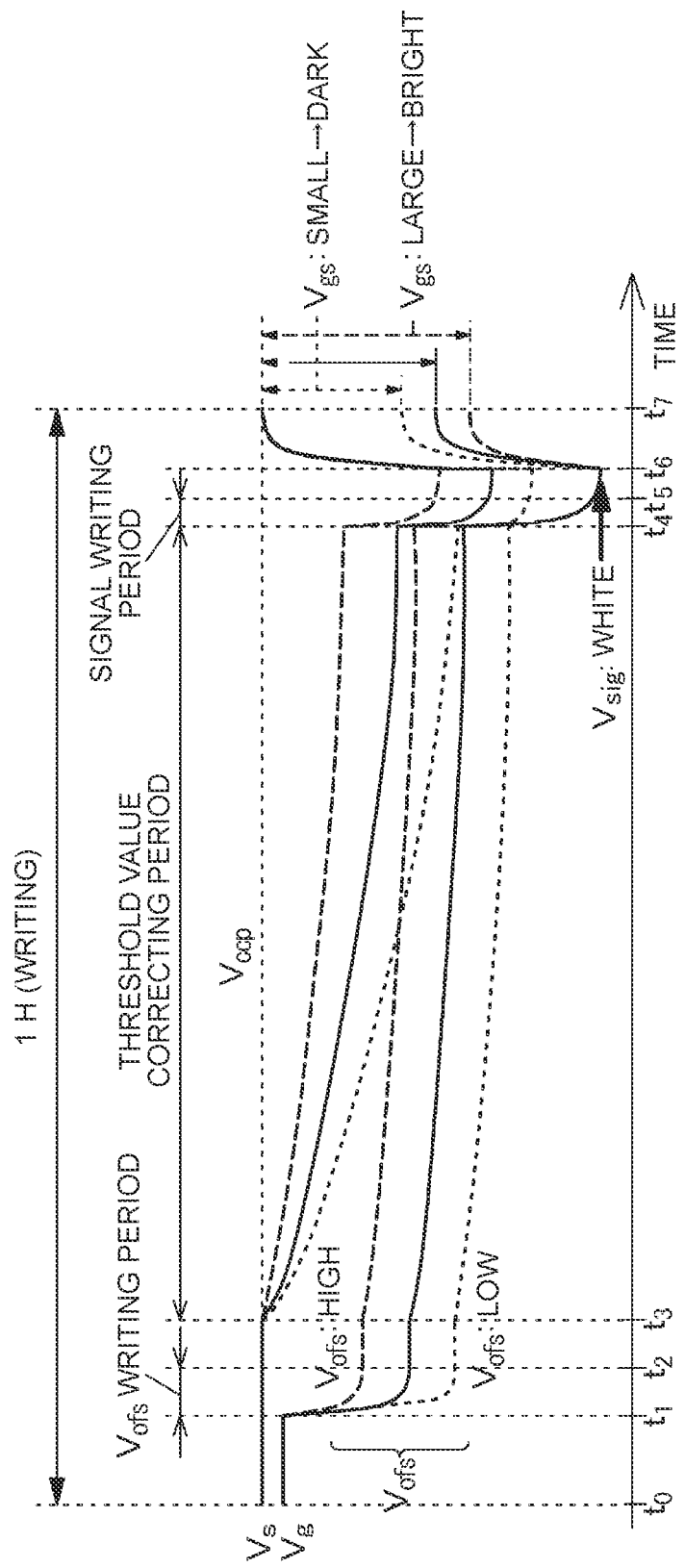
FIG. 8 is a timing waveform chart for describing the operation accompanied by a difference in the level of the initialization voltage $V_{ofs}$ when a signal voltage $V_{sig}$ of a video signal of black luminance is written.

More specifically, since it is difficult to visually recognize the surface roughness in a relatively high luminance region, the gate-source voltage $V_{gs}$ of the driving transistor $Tr_1$ is set relatively small. In the pixel circuit of FIG. 2 in which the driving transistor $Tr_1$ includes the P-channel transistor, in a case where the signal voltage $V_{sig}$ of the video signal is COMPLETELY WHITE (high luminance), as illustrated in FIG. 7A, the initialization voltage $V_{ofs}$ is set relatively high (+). In FIG. 8, illustrated is a timing waveform chart for describing the operation depending on a difference in level of the initialization voltage $V_{ofs}$ when the signal voltage $V_{sig}$ of the video signal of white luminance is written. In the case of white luminance, by setting the initialization voltage $V_{ofs}$ relatively high (broken line in the drawing) depending on the signal voltage $V_{sig}$ of the video signal, the gate-source voltage $V_{gs}$ of the driving transistor $Tr_1$ increases, and thus the luminance becomes relatively bright.

Figure 7B:
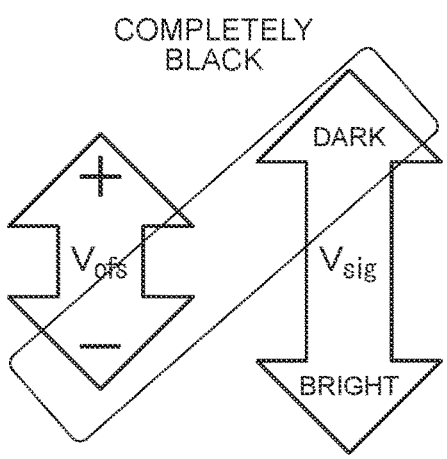
FIG. 7B is an explanatory diagram of a specific example of changing the initialization voltage depending on a signal voltage of a video signal.
Figure 9:
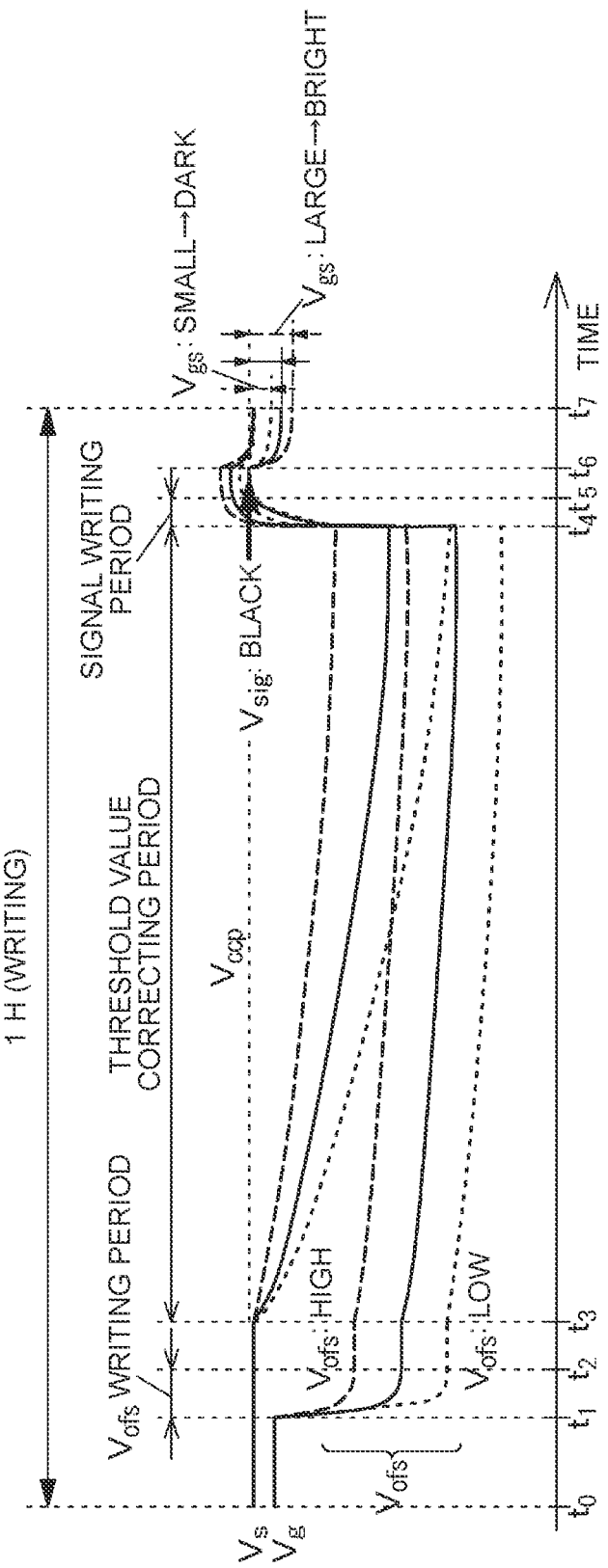
FIG. 9 is a timing waveform chart for describing the operation accompanied by a difference in the level of the initialization voltage $V_{ofs}$ when a signal voltage $V_{sig}$ of a video signal of white luminance is written.

In addition, in a luminance region having a luminance lower than that of the relatively high luminance region, since the surface roughness is easily visually recognized, the gate-source voltage $V_{gs}$ of the driving transistor $Tr_1$ is set relatively large. In the pixel circuit of FIG. 2 in which the driving transistor $Tr_1$ includes the P-channel transistor, in a case where the signal voltage $V_{sig}$ of the video signal is COMPLETELY BLACK (low luminance), as illustrated in FIG. 7B, the initialization voltage $V_{ofs}$ is set relatively low (−). In FIG. 9, illustrated is a timing waveform chart for describing the operation depending on a difference in level of the initialization voltage $V_{ofs}$ when the signal voltage $V_{sig}$ of the video signal of black luminance is written. In the case of black luminance, by setting the initialization voltage $V_{ofs}$ relatively low (dotted line in the drawing) depending on the signal voltage $V_{sig}$ of the video signal, the gate-source voltage $V_{gs}$ of the driving transistor $Tr_1$ decreases, and thus the luminance becomes relatively dark.

Figure 7C:
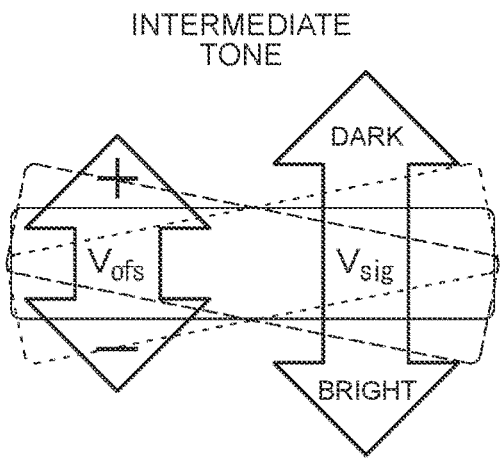
FIG. 7C is an explanatory diagram of a specific example of changing the initialization voltage depending on a signal voltage of a video signal.

When the signal voltage $V_{sig}$ of the video signal is in an intermediate tone, the initialization voltage $V_{ofs}$ is set depending on the gradation between $V_{ofs}$ in the case of COMPLETELY WHITE and $V_{ofs}$ in the case of COMPLETELY BLACK as illustrated in FIG. 7C. That is, in the case of an intermediate tone, in a case where the luminance is bright, the initialization voltage $V_{ofs}$ is set to be high (+) as indicated by a broken-line square in FIG. 7C, in the case where the luminance is dark, the initialization voltage $V_{ofs}$ is set to be low (−) as indicated by a dotted square in FIG. 7C, and in a case where the luminance is intermediate, the initialization voltage $V_{ofs}$ is set to be intermediate as indicated by a solid square in FIG. 7C.

As described above, in the organic EL display device 10 and the drive method thereof according to the present embodiment, the initialization voltage $V_{ofs}$ is varied and set depending on the signal voltage $V_{sig}$ of the video signal for each pixel in which the signal voltage $V_{sig}$ of the video signal is written. As a result, gradation 0 can be displayed darker, and high luminance can be implemented even with a limited amplitude of the signal voltage $V_{sig}$ of the video signal, and thus both improvement of the light emission luminance and high contrast can be achieved.

The initialization voltage $V_{ofs}$ which is variable depending on the signal voltage $V_{sig}$ of the video signal is generated in the signal output unit 60 for each pixel in which the signal voltage $V_{sig}$ of the video signal is written. That is, the signal output unit 60 is capable of alternatively outputting the signal voltage $V_{sig}$ of the video signal corresponding to the luminance information and the initialization voltage $V_{ofs}$ variable depending on the signal voltage $V_{sig}$ for each pixel in which the signal voltage $V_{sig}$ of the video signal is written.

Hereinafter, an example of a configuration of the signal output unit 60 that alternatively outputs the signal voltage $V_{sig}$ of the video signal corresponding to the luminance information and the initialization voltage $V_{ofs}$ variable depending on the signal voltage $V_{sig}$ will be described with reference to the system configuration diagram of FIG. 1.

As illustrated in FIG. 1, the signal output unit 60 includes an interface 61, a $V_{sig}$ gamma circuit 62 as a first gamma (γ) circuit, a $V_{ofs}$ gamma circuit 63 as a second gamma (γ) circuit, and a horizontal drive unit 64.

The interface 61 acquires the video signal corresponding to the luminance information supplied from an external signal supply source (not illustrated) and outputs the signal voltage $V_{sig}$ and the initialization voltage $V_{ofs}$ on the basis of the video signal. The signal voltage $V_{sig}$ output from the interface 61 is supplied to the $V_{sig}$ gamma circuit 62, the $V_{ofs}$ gamma circuit 63, and the horizontal drive unit 64. The initialization voltage $V_{ofs}$ output from the interface 61 is supplied to the $V_{ofs}$ gamma circuit 63 and the horizontal drive unit 64.

The $V_{sig}$ gamma circuit 62, as the first gamma circuit, performs gamma correction on the signal voltage $V_{sig}$ of the video signal supplied from the interface 61 to the horizontal drive unit 64 and determines signal voltages $V_{sig}$ corresponding to the gradation. On the basis of the signal voltage $V_{sig}$ of the video signal supplied from the interface 61, the $V_{ofs}$ gamma circuit 63, as the second gamma circuit, performs the gamma correction on the initialization voltage $V_{ofs}$ supplied from the interface 61 to the horizontal drive unit 64 and determines initialization voltages $V_{ofs}$ corresponding to the gradation. By the action of the $V_{ofs}$ gamma circuit 63, the signal voltage $V_{sig}$ of the video signal and the initialization voltage $V_{ofs}$ variable depending on the signal voltage $V_{sig}$ are alternatively output from the signal output unit 60 to the signal line 34.

Hereinafter, a specific example of the signal output unit 60 that generates the initialization voltage $V_{ofs}$ variable depending on the signal voltage $V_{sig}$ of the video signal will be described.

First Example

Figure 10A:
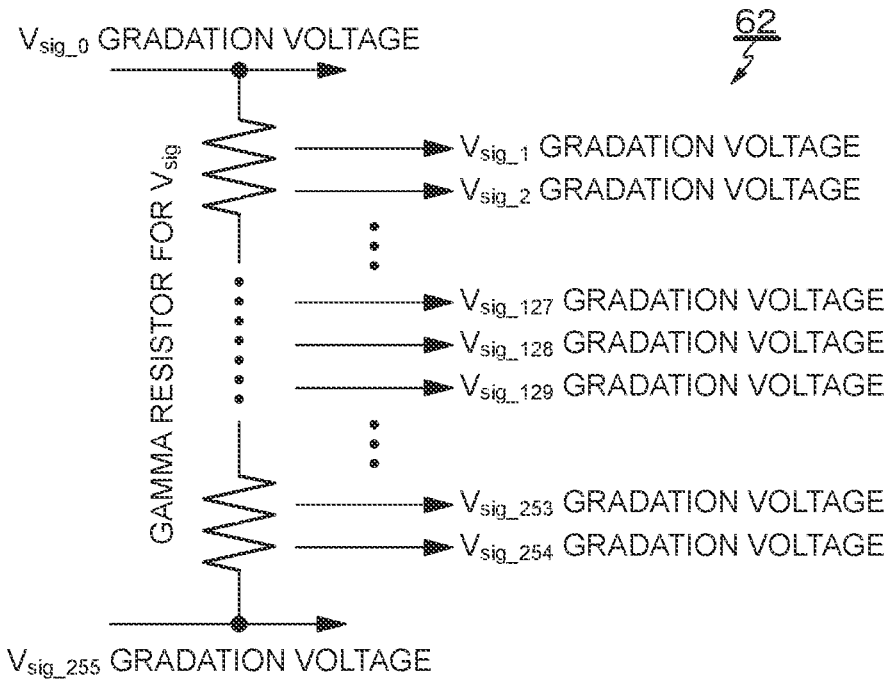
FIG. 10A is a circuit diagram illustrating an example of a configuration of a signal output unit according to a first example.
Figure 10B:
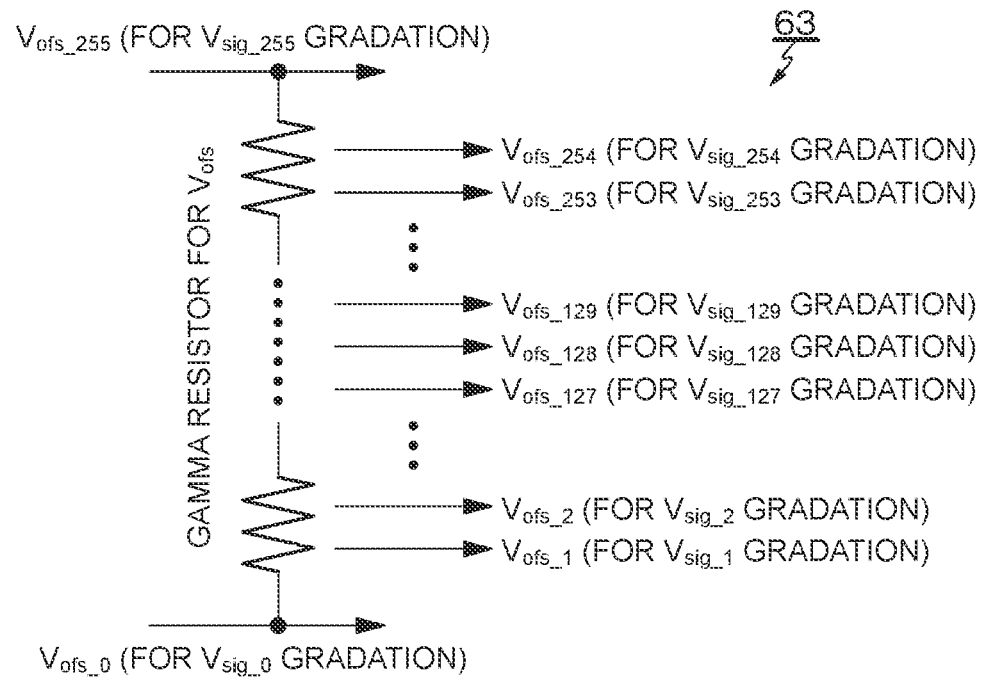
FIG. 10B is a circuit diagram illustrating an example of a configuration of the signal output unit according to the first example.

A first example is an example of generating the initialization voltage $V_{ofs}$ using a ladder resistance circuit. A configuration example of a signal output unit 60 according to the first example is illustrated in FIGS. 10A and 10B. FIG. 10A is a circuit diagram illustrating an example of a circuit configuration of a $V_{sig}$ gamma circuit 62, and FIG. 10B is a circuit diagram illustrating an example of a circuit configuration of a $V_{ofs}$ gamma circuit 63.

As illustrated in FIG. 10A, the $V_{sig}$ gamma circuit 62 includes a ladder resistance circuit, in which a plurality of resistance elements is connected in a ladder shape and a voltage is applied to all the resistance elements, and generates signal voltages $V_{sig}$ corresponding to the gradation of the video signal. Specifically, in the $V_{sig}$ gamma circuit 62, voltages $V_{sig\_0}$ and $V_{sig\_255}$ are applied to both ends of the ladder resistor to generate signal voltages $V_{sig\_1}$ to $V_{sig\_254}$.

Similarly to the $V_{sig}$ gamma circuit 62, the $V_{ofs}$ gamma circuit 63 also includes a ladder resistance circuit as illustrated in FIG. 10B and generates initialization voltages $V_{ofs}$ corresponding to the gradation of the video signal. Specifically, in the $V_{sig}$ gamma circuit 62, voltages $V_{ofs\_255}$ (for $V_{sig\_255}$ gradation) and $V_{ofs\_0}$ (for $V_{sig\_0}$ gradation) are applied to both ends of the ladder resistor to generate initialization voltages $V_{ofs\_254}$ (for $V_{sig\_254}$ gradation) to $V_{ofs\_1}$ (for $V_{sig\_1}$ gradation).

In this manner, in the $V_{sig}$ gamma circuit 62, the initialization voltages $V_{ofs}$ are generated so as to match to the gradation of the video signal. Then, an initialization voltage $V_{ofs}$ generated depending on the gradation of the video signal is applied from the horizontal drive unit 64 through a signal line 34 for each pixel in which the signal voltage $V_{sig}$ of the video signal is written.

Second Example

A second example is a modification of the first example, in which the $V_{sig}$ gamma circuit 62 including the ladder resistance circuit is used also for generating the initialization voltage $V_{ofs}$. A configuration example of a signal output unit 60 according to the second example is illustrated in FIG. 11.

Figure 11:
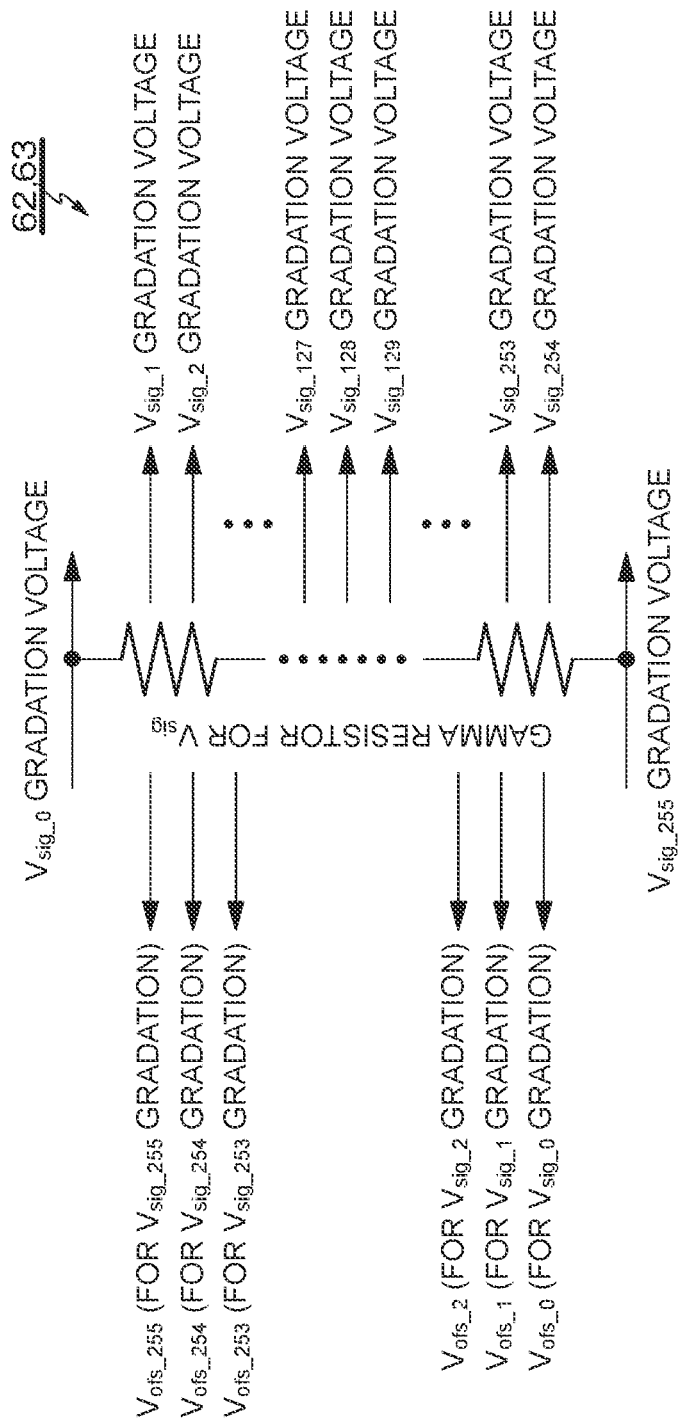
FIG. 11 is a circuit diagram illustrating an example of a configuration of a signal output unit according to a second example.

As illustrated in FIG. 11, in the signal output unit 60 according to the second example, the $V_{sig}$ gamma circuit 62 including the ladder resistance circuit is used also as the $V_{ofs}$ gamma circuit 63 to generate the initialization voltages $V_{ofs}$ corresponding to the gradation of a video signal. Specifically, the voltages $V_{sig\_0}$ and $V_{sig\_255}$ are applied to both ends of the ladder resistor to generate the signal voltages $V_{sig\_1}$ to $V_{sig\_254}$, and the same ladder resistor is used to generate the initialization voltages $V_{ofs\_255}$ (for $V_{sig\_255}$ gradation) to $V_{ofs\_0}$ (for $V_{sig\_0}$ gradation). Then, an initialization voltage $V_{ofs}$ generated depending on the gradation of the video signal is applied from the horizontal drive unit 64 through a signal line 34 for each pixel in which the signal voltage $V_{sig}$ of the video signal is written.

Third Example

A third example is an example in which the initialization voltage $V_{ofs}$ is generated using a ramp (RAMP) waveform in which the potential varies uniformly. In a case where the initialization voltage $V_{ofs}$ is generated using the ramp waveform, it is based on the premise that a $V_{sig}$ gamma circuit 62 includes a ramp wave generating circuit that generates a ramp waveform. Examples of the ramp wave generating circuit include a digital-analog conversion circuit (DAC).

Figure 12:
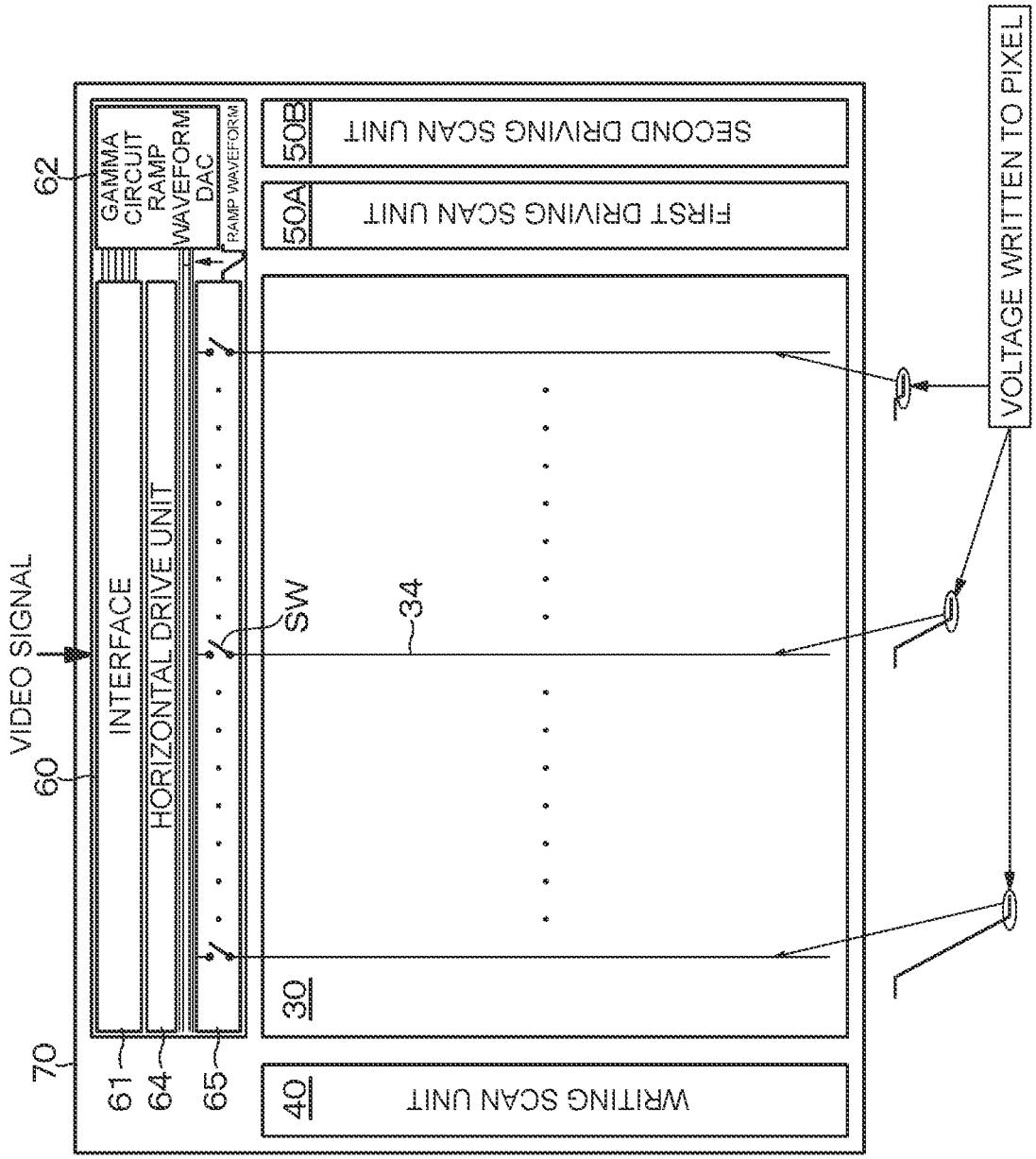
FIG. 12 is a system configuration diagram schematically illustrating an overview of a configuration of an organic EL display device using a ramp wave generating circuit as a $V_{sig}$ gamma circuit.
Figure 13:
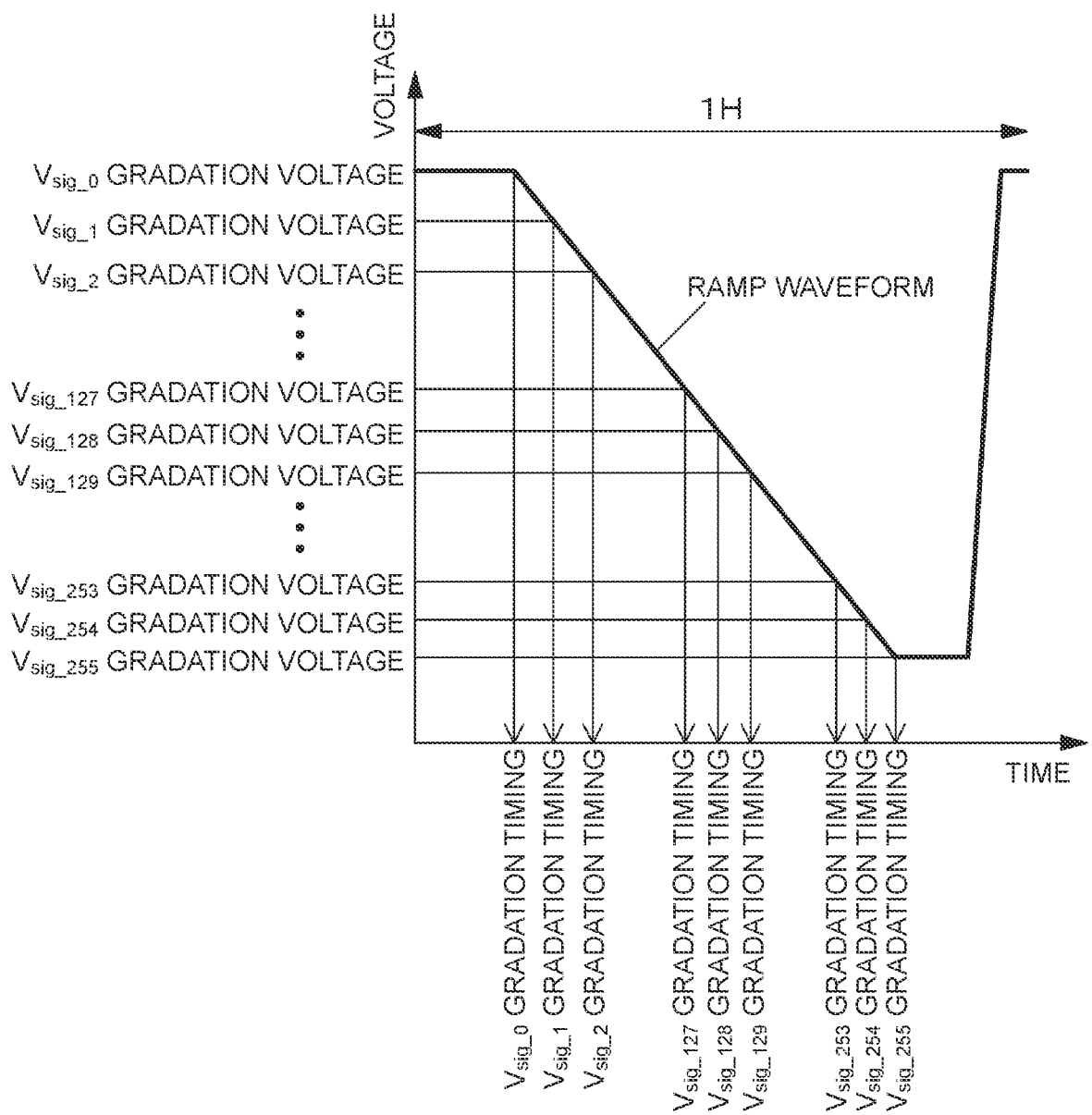
FIG. 13 is a waveform chart illustrating a ramp waveform in which the potential uniformly varies from $V_{sig\_0}$ gradation to $V_{sig\_255}$ gradation in a 1 H period.

FIG. 12 is a system configuration diagram schematically illustrating an overview of a configuration of an organic EL display device using a ramp wave generating circuit as a $V_{sig}$ gamma circuit 62. In a signal output unit 60, the $V_{sig}$ gamma circuit 62 uses, for example, a digital-analog conversion circuit (DAC) as a ramp wave generating circuit and generates a ramp waveform whose potential uniformly varies from $V_{sig\_0}$ gradation to $V_{sig\_255}$ gradation in a 1 H period as illustrated in FIG. 13.

The signal output unit 60 includes a switch unit 65 included on an output side of the horizontal drive unit 64 for every pixel column, the switch unit 65 including switch elements SW that samples the ramp waveform generated in the $V_{sig}$ gamma circuit 62. Each of the switch elements SW of the switch unit 65 is turned on (closed) at timing corresponding to gradation (gradation timing in FIG. 13) to be written in pixels 20, thereby sampling the ramp waveform to determine signal voltages $V_{sig}$ to be written in the pixels 20.

Figure 14:
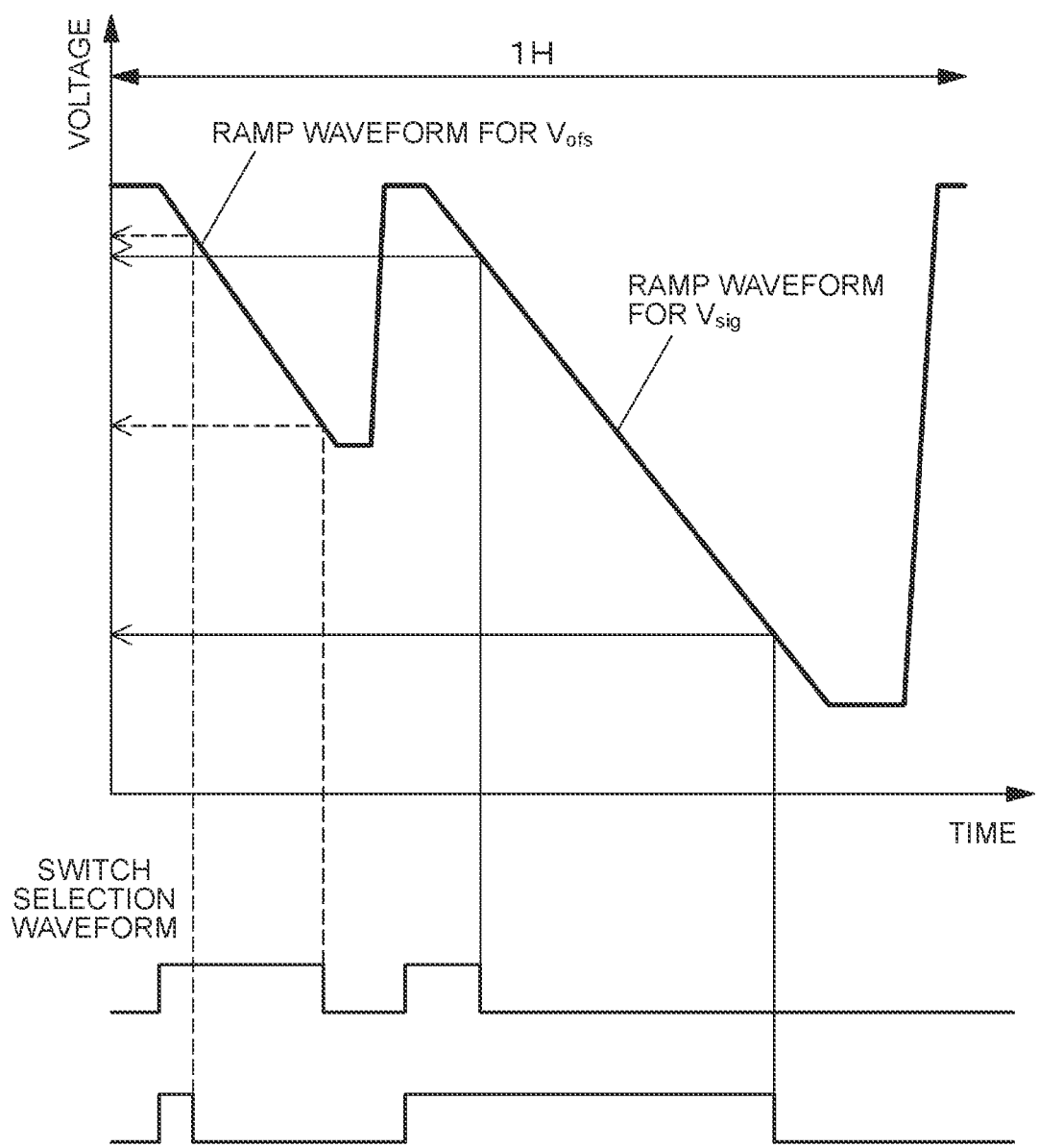
FIG. 14 is a waveform chart illustrating a ramp waveform for $V_{sig}$ in a signal output unit according to a third example.

In the signal output unit 60 according to the third example, the $V_{sig}$ gamma circuit 62 that generates the ramp waveform is also used as the $V_{ofs}$ gamma circuit 63 and generates the initialization voltages $V_{ofs}$ corresponding to the gradation of the video signal using the ramp waveform. As illustrated in FIG. 14, similarly to the signal voltage $V_{sig}$, the voltage value of the initialization voltage $V_{ofs}$ varies depending on the write timing.

As described above, in the organic EL display device in which the ramp wave generating circuit, for example, a digital-analog conversion circuit (DAC) is used as the $V_{sig}$ gamma circuit 62, the signal output unit 60 according to the third example generates the initialization voltages $V_{ofs}$ using the ramp waveform as illustrated in FIG. 14 similarly to the signal voltages $V_{sig}$. Similarly to the ramp waveform for the signal voltage $V_{sig}$, the ramp waveform for the initialization voltage $V_{ofs}$ is also generated by the $V_{sig}$ gamma circuit 62 including a DAC.

Figure 15:
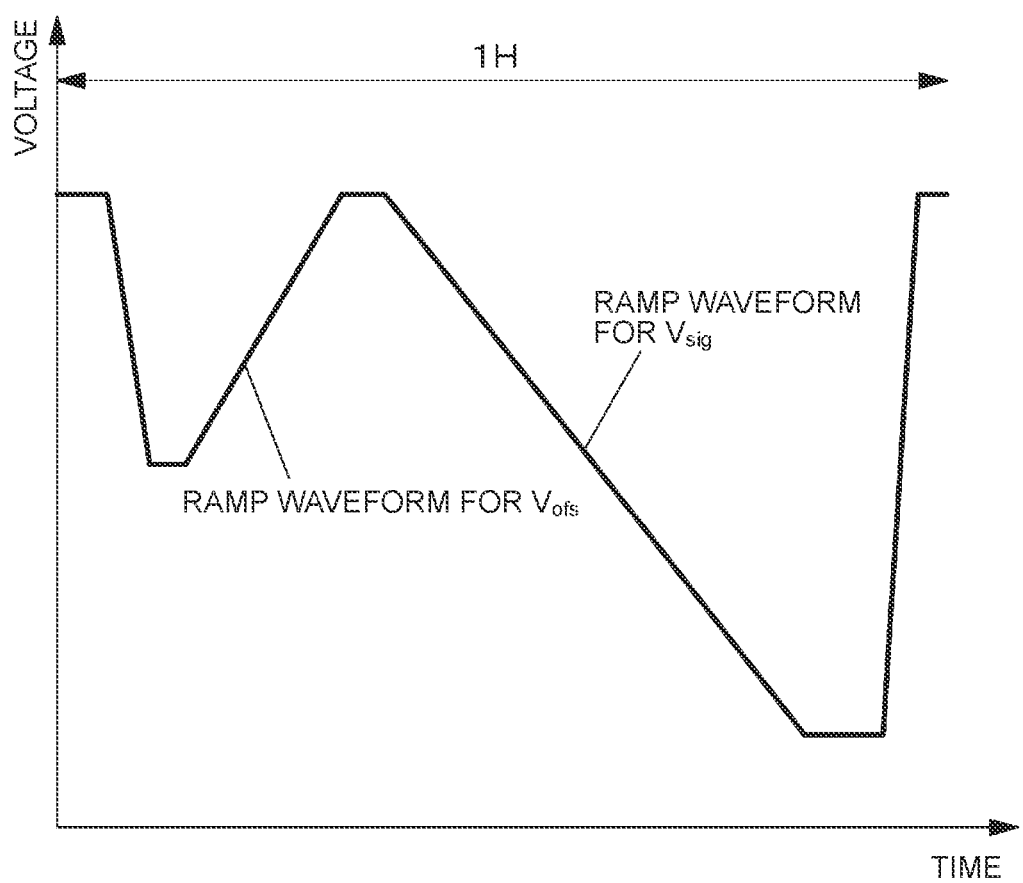
FIG. 15 is a waveform chart illustrating another example of a ramp waveform for $V_{sig}$ in the signal output unit according to the third example.

Note that, in the waveform chart of FIG. 14, the ramp waveform for the initialization voltage $V_{ofs}$ is a ramp waveform in which the inclination uniformly varies from a high potential to a low potential, however, as illustrated in the waveform chart of FIG. 15, a ramp waveform may have an inclination that uniformly varies from a low potential to a high potential.

<Modification>

Although the technology according to the present disclosure has been described above on the basis of the preferred embodiments, the technology according to the present disclosure is not limited to the embodiments. The configurations and the structures of the display devices described in the above embodiments are exemplary and can be modified as appropriate. For example, although the organic EL display device has been described as an example as a display device to which the technology according to the present disclosure is applied, the technology according to the present disclosure is not limited to application to the organic EL display devices and can be applied to all display devices having a configuration in which a gate voltage of a driving transistor $Tr_1$ is initialized using an initialization voltage $V_{ofs}$ and threshold value correction is thereby performed.

<Electronic Device of Present Disclosure>

The display devices of the present disclosure described above can be used as a display unit (display device) of an electronic device in many fields that displays a video signal input to the electronic device or a video signal generated in the electronic device as an image or a video. Examples of the electronic devices include, for example, a television set, a laptop personal computer, a digital still camera, a mobile terminal device (mobile device) such as a mobile phone, a head-mounted display, or the like. However, it is not limited thereto.

As described above, in electronic devices in many fields, the following effects can be obtained by using a display device of the present disclosure as a display unit thereof. That is, according to a display device of the present disclosure, a frame of a display panel can be made narrower. Therefore, use of a display device of the present disclosure can contribute to downsizing of an electronic device body.

The display devices of the present disclosure also include one having a module shape of a sealed configuration. As an example, a display module which is formed by attaching a facing unit, such as transparent glass, to a pixel array unit is applicable. Note that the display module may include a circuit unit for inputting and outputting signals and the like from the outside to the pixel array unit, a flexible printed circuit (FPC), and the like. Hereinafter, a head-mounted display will be used as a specific example of an electronic device using the display device of the present disclosure.

[Head-Mounted Display]

Figure 16:
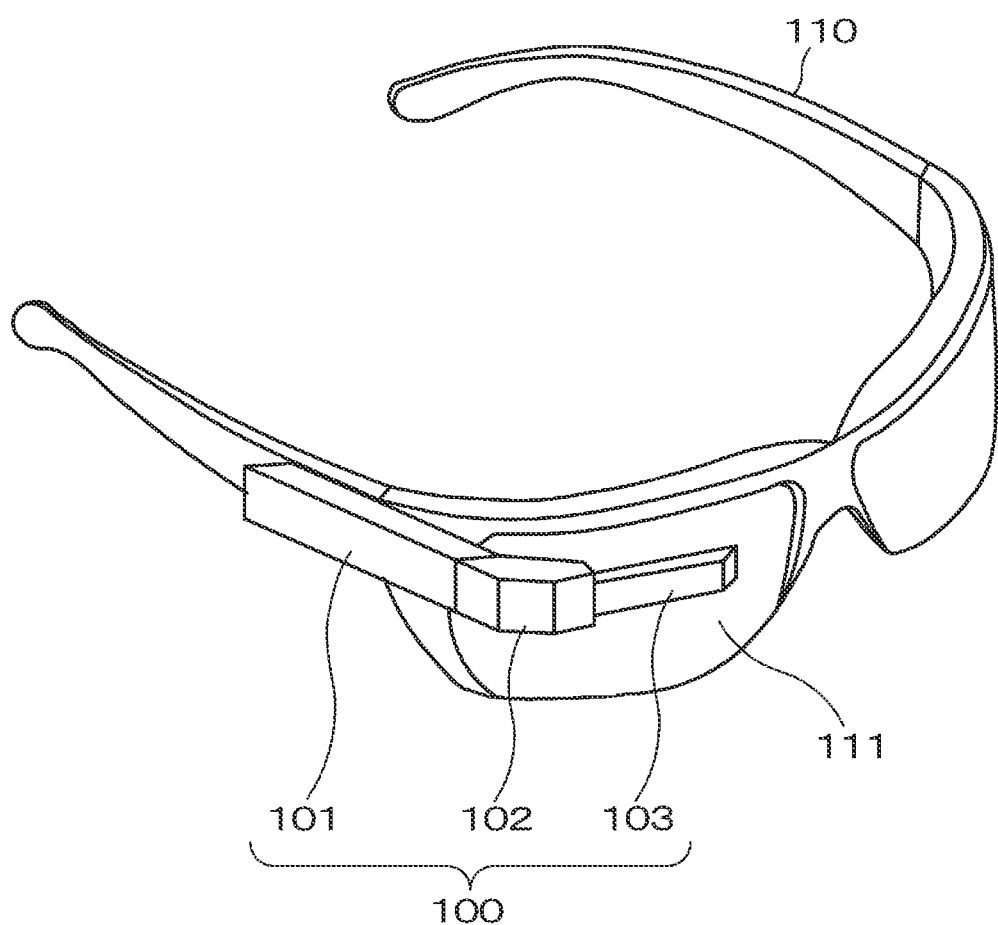
FIG. 16 is an external view illustrating an example of a head-mounted display according to a specific example of the electronic device of the present disclosure.

FIG. 16 is an external view illustrating an example of a head-mounted display according to a specific example of the electronic device of the present disclosure.

A head-mounted display 100 has a transmissive head-mounted display configuration including a main body 101, an arm unit 102, and a lens barrel 103. The main body 101 is connected with the arm unit 102 and spectacles 110. Specifically, an end of the main body 101 in the longitudinal direction is attached to the arm unit 102. In addition, one side of the side faces of the main body 101 is connected to the spectacles 110 via a connection member (not illustrated). Note that the main body 101 may be directly mounted on the head of a human body.

The main body 101 incorporates a control board for controlling the operation of the head-mounted display 100 and a display unit. The arm unit 102 supports the lens barrel 103 with respect to the main body 101 by connecting the main body 101 and the lens barrel 103. Specifically, the arm unit 102 fixes the lens barrel 103 with respect to the main body 101 by being connected to the end of the main body 101 and an end of the lens barrel 103. Furthermore, the arm unit 102 incorporates a signal line for communicating data related to an image provided from the main body 101 to the lens barrel 103.

The lens barrel 103 projects image light provided from the main body 101 via the arm unit 102 toward the eyes of a user wearing the head-mounted display 100 through lenses 111 of the spectacles 110.

In the head-mounted display 100 described above, the display device of the present disclosure can be used as the display unit incorporated in the main body 101. That is, the head-mounted display 100 according to the specific example is manufactured by using the display device of the present disclosure as the display unit thereof. Furthermore, by using the display device of the present disclosure, gradation 0 can be displayed darker, and high luminance can be implemented even with a limited amplitude of the signal voltage $V_{sig}$ of the video signal, and thus both improvement of the light emission luminance and high contrast can be achieved.

<Possible Configurations of Present Disclosure>

Note that the present disclosure can also have the following configurations.

<<A. Display Device>>

[A-01] A display device comprising:
a pixel array unit in which pixels are two-dimensionally arranged in a matrix shape, each of the pixels including a light emitting element and a driving transistor that drives the light emitting element; and
a signal output unit that outputs, to each of the pixels of the pixel array unit, a signal voltage of a video signal and an initialization voltage for initializing a gate voltage of the driving transistor,
wherein the signal output unit varies the initialization voltage depending on the signal voltage of the video signal for each of the pixels to which the signal voltage of the video signal is written.

[A-02] The display device according to the item [A-01],
wherein the signal output unit sets a voltage between a gate electrode and a source electrode of the driving transistor to be relatively low in a relatively high luminance region.

[A-03] The display device according to the item [A-02],
wherein the signal output unit sets the voltage between the gate electrode and the source electrode of the driving transistor to be relatively high in a luminance region having a luminance lower than a luminance of the relatively high luminance region.

[A-04] The display device according to the item [A-02],
wherein the driving transistor includes a P-channel transistor, and
the signal output unit sets the initialization voltage relatively high in the relatively high luminance region.

[A-05] The display device according to the item [A-04],
wherein the signal output unit sets the initialization voltage to be relatively low in a luminance region having a luminance lower than a luminance of the relatively high luminance region.

[A-06] The display device according to any one of the items [A-01] to [A-05],
wherein the display device has a threshold value correcting function of varying a source voltage of the driving transistor toward a voltage obtained by subtracting a threshold voltage of the driving transistor from the initialization voltage with reference to the initialization voltage obtained by initializing the gate voltage of the driving transistor.

[A-07] The display device according to any one of the items [A-01] to [A-06],
wherein the signal output unit includes a first gamma circuit that performs gamma correction on the signal voltage of the video signal and determines signal voltages corresponding to gradation.

[A-08] The display device according to the item [A-07],
wherein the signal output unit includes a second gamma circuit that performs gamma correction on the initialization voltage on a basis of the signal voltage of the video signal and determines initialization voltages corresponding to the gradation.

[A-09] The display device according to the item [A-08],
wherein the first gamma circuit includes a ladder resistance circuit and generates signal voltages corresponding to the gradation of the video signal, and
the second gamma circuit includes a ladder resistance circuit and generates initialization voltages corresponding to the gradation of the video signal.

[A-10] The display device according to the item [A-08],
wherein the second gamma circuit generates the initialization voltages corresponding to the gradation of the video signal using the first gamma circuit including a ladder resistance circuit.

[A-11] The display device according to the item [A-08],
wherein the first gamma circuit includes a ramp wave generating circuit that generates a ramp waveform whose potential varies uniformly,
the first gamma circuit includes a switch unit that samples a ramp waveform at timing corresponding to gradation to be written in pixels and determines signal voltages to be written in the pixels, and
the initialization voltages corresponding to the gradation of the video signal are also generated using the ramp waveform.

[A-12] The display device according to the item [A-11],
wherein the ramp wave generating circuit includes a digital-analog conversion circuit.

[A-13] The display device according to any one of the items [A-01] to [A-12],
wherein the light emitting element includes a current-driven electro-optical element in which light emission luminance varies depending on a value of a current flowing through the device.

[A-14] The display device according to the item [A-13],
wherein the current-driven electro-optical element includes an organic electroluminescence element.

<<B. Drive Method for Display Device>>

[B-01] A drive method of a display device that includes:
a pixel array unit in which pixels are two-dimensionally arranged in a matrix shape, each of the pixels including a light emitting element and a driving transistor that drives the light emitting element; and
a signal output unit that outputs, to each of the pixels of the pixel array unit, a signal voltage of a video signal and an initialization voltage for initializing a gate voltage of the driving transistor, the drive method for driving the display device, comprising:
varying the initialization voltage depending on the signal voltage of the video signal for each of the pixels to which the signal voltage of the video signal is written.

[B-02] The drive method of the display device according to the item [B-01],
in which the signal output unit sets a voltage between a gate electrode and a source electrode of the driving transistor to be relatively low in a relatively high luminance region.

[B-03] The drive method of the display device according to the item [B-02],
in which the signal output unit sets the voltage between the gate electrode and the source electrode of the driving transistor to be relatively high in a luminance region having a luminance lower than a luminance of the relatively high luminance region.

[B-04] The drive method of the display device according to the item [B-02],
in which the driving transistor includes a P-channel transistor, and
the signal output unit sets the initialization voltage relatively high in the relatively high luminance region.

[B-05] The drive method of the display device according to the item [B-04],
in which the signal output unit sets the initialization voltage to be relatively low in a luminance region having a luminance lower than a luminance of the relatively high luminance region.

[B-06] The drive method of the display device according to any one of the items [B-01] to [B-05],
in which the electronic device has a threshold value correcting function of varying a source voltage of the driving transistor toward a voltage obtained by subtracting a threshold voltage of the driving transistor from the initialization voltage with reference to the initialization voltage obtained by initializing the gate voltage of the driving transistor.

[B-07] The drive method of the display device according to any one of the items [B-01] to [B-06],
in which the light emitting element includes a current-driven electro-optical element in which light emission luminance varies depending on a value of a current flowing through the device.

[B-08] The drive method of the display device according to the item [B-07],
in which the current-driven electro-optical element includes an organic electroluminescence element.

<<C. Electronic Device>>

[C-01] An electronic device comprising a display device that includes:
a pixel array unit in which pixels are two-dimensionally arranged in a matrix shape, each of the pixels including a light emitting element and a driving transistor that drives the light emitting element; and
a signal output unit that outputs, to each of the pixels of the pixel array unit, a signal voltage of a video signal and an initialization voltage for initializing a gate voltage of the driving transistor,
wherein the signal output unit varies the initialization voltage depending on the signal voltage of the video signal for each of the pixels to which the signal voltage of the video signal is written.

[C-02] The electronic device according to the item [C-01],
in which the signal output unit sets a voltage between a gate electrode and a source electrode of the driving transistor to be relatively low in a relatively high luminance region.

[C-03] The electronic device according to the item [C-02],
in which the signal output unit sets the voltage between the gate electrode and the source electrode of the driving transistor to be relatively high in a luminance region having a luminance lower than a luminance of the relatively high luminance region.

[C-04] The electronic device according to the item [C-02],
in which the driving transistor includes a P-channel transistor, and
the signal output unit sets the initialization voltage relatively high in the relatively high luminance region.

[C-05] The electronic device according to the item [C-04],
in which the signal output unit sets the initialization voltage to be relatively low in a luminance region having a luminance lower than a luminance of the relatively high luminance region.

[C-06] The electronic device according to any one of the items [C-01] to [C-05],
in which the electronic device has a threshold value correcting function of varying a source voltage of the driving transistor toward a voltage obtained by subtracting a threshold voltage of the driving transistor from the initialization voltage with reference to the initialization voltage obtained by initializing the gate voltage of the driving transistor.

[C-07] The electronic device according to any one of the items [C-01] to [C-06],
in which the signal output unit includes a first gamma circuit that performs gamma correction on the signal voltage of the video signal and determines signal voltages corresponding to gradation.

[C-08] The electronic device according to the item [C-07],
in which the signal output unit includes a second gamma circuit that performs gamma correction on the initialization voltage on the basis of the signal voltage of the video signal and determines initialization voltages corresponding to the gradation.

[C-09] The electronic device according to the item [C-08],
in which the first gamma circuit includes a ladder resistance circuit and generates signal voltages corresponding to the gradation of the video signal, and
the second gamma circuit includes a ladder resistance circuit and generates initialization voltages corresponding to the gradation of the video signal.

[C-10] The electronic device according to the item [C-08],
in which the second gamma circuit generates initialization voltages corresponding to the gradation of the video signal using the first gamma circuit including a ladder resistance circuit.

[C-11] The electronic device according to the item [C-08],
in which the first gamma circuit includes a ramp wave generating circuit that generates a ramp waveform whose potential varies uniformly,
the first gamma circuit includes a switch unit that samples a ramp waveform at timing corresponding to gradation to be written in pixels and determines signal voltages to be written in the pixels, and
the initialization voltages corresponding to the gradation of the video signal are also generated using the ramp waveform.

[C-12] The electronic device according to the item [C-11],
in which the ramp wave generating circuit includes a digital-analog conversion circuit.

[C-13] The electronic device according to any one of the items [C-01] to [C-12],
in which the light emitting element includes a current-driven electro-optical element in which light emission luminance varies depending on a value of a current flowing through the device.

[C-14] The electronic device according to the item [C-13],
in which the current-driven electro-optical element includes an organic electroluminescence element.

REFERENCE SIGNS LIST

10 Organic EL Display Device
20 Pixel
30 Pixel Array Unit
31 ($31_1$ to $31_m$) Scanning Line
32 ($32_1$ to $32_m$) First Drive Line
33 ($33_1$ to $33_m$) Second Drive Line
34 ($34_1$ to $34_n$) Signal Line
40 Writing Scan Unit
50A First Driving Scan Unit
50B Second Driving Scan Unit
60 Signal Output Unit
61 Interface
62 $V_{sig}$ Gamma Circuit
63 $V_{ofs}$ Gamma Circuit
64 Horizontal Drive Unit
65 Switch Unit
70 Display Panel OLED Organic EL Element $Tr_1$ Driving Transistor
$Tr_2$ Writing Transistor (Sampling Transistor)
$Tr_3$ Light Emission Controlling Transistor
$Tr_4$ Switching Transistor
$C_1$ Holding Capacitor
$C_2$ Auxiliary Capacitor

The invention claimed is:

1. A display device, comprising:
a pixel array unit that includes a plurality of pixels in a two-dimensional arrangement in a matrix,
  wherein each pixel of the plurality of pixels includes:
    a light emitting element; and
    a driving transistor configured to drive the light emitting element; and
a signal output unit configured to:
  output, to each pixel of the plurality of pixels, a first signal voltage of a video signal and a first initialization voltage,
    wherein the first initialization voltage is for initialization of a gate voltage of the driving transistor;
  vary the first initialization voltage based on the first signal voltage of the video signal;
  set a voltage between a gate electrode of the driving transistor and a source electrode of the driving transistor to a first value for a first luminance region of the display device; and
  set the voltage between the gate electrode of the driving transistor and the source electrode of the driving transistor to a second value for a second luminance region of the display device, wherein
    the second value is higher than the first value, and
    a luminance of the second luminance region is lower than a luminance of the first luminance region.

2. The display device according to claim 1, wherein
the driving transistor includes a P-channel transistor, and
the signal output unit is further configured to set the first initialization voltage to a third value for the first luminance region.

3. The display device according to claim 2, wherein
the signal output unit is further configured to set the first initialization voltage to a fourth value for the second luminance region, and
the fourth value is lower than the third value.

4. The display device according to claim 1, wherein the display device has a threshold value correcting function to vary a source voltage of the driving transistor toward a specific voltage obtained by subtraction of a threshold voltage of the driving transistor from the first initialization voltage.

5. The display device according to claim 1, wherein the signal output unit includes a first gamma circuit configured to:
  perform gamma correction on the first signal voltage of the video signal; and
  determine, based on the gamma correction on the first signal voltage of the video signal, second signal voltages corresponding to gradation of the video signal.

6. The display device according to claim 5, wherein the signal output unit further includes a second gamma circuit configured to:
  perform the gamma correction on the first initialization voltage based on the first signal voltage of the video signal; and
  determine, based on the gamma correction on the first initialization voltage, second initialization voltages corresponding to the gradation.

7. The display device according to claim 6, wherein
the first gamma circuit includes a first ladder resistance circuit configured to generate the second signal voltages corresponding to the gradation, and
the second gamma circuit includes a second ladder resistance circuit configured to generate the second initialization voltages corresponding to the gradation.

8. The display device according to claim 6, wherein
the first gamma circuit includes a ladder resistance circuit, and
the second gamma circuit is further configured to generate the second initialization voltages based on the ladder resistance circuit of the first gamma circuit.

9. The display device according to claim 6, wherein the first gamma circuit includes: a ramp wave generating circuit configured to generate a ramp waveform, wherein a potential of the ramp waveform is uniformly variable; and a switch unit configured to: sample the ramp waveform at timing corresponding to the gradation to be written in pixels; and determine signal voltages to be written in the pixels, and the second initialization voltages corresponding to the gradation of the video signal are generated based on the ramp waveform.

10. The display device according to claim 9, wherein the ramp wave generating circuit includes a digital-analog conversion circuit.

11. The display device according to claim 1, wherein the light emitting element includes a current-driven electro-optical element in which a light emission luminance varies based on a value of a current that flows through the display device.

12. The display device according to claim 11, wherein the current-driven electro-optical element includes an organic electroluminescence element.

13. A drive method, comprising:
in a display device that includes a signal output unit and a pixel array unit that includes a plurality of pixels in a two-dimensional arrangement in a matrix, each pixel of the plurality of pixels including a light emitting element and a driving transistor that drives the light emitting element:
  outputting, by the signal output unit, to each pixel of the plurality of pixels, a signal voltage of a video signal and an initialization voltage,
    wherein the initialization voltage is for initializing a gate voltage of the driving transistor;
  varying, by the signal output unit, the initialization voltage based the signal voltage of the video signal;
  setting, by the signal output unit, a voltage between a gate electrode of the driving transistor and a source electrode of the driving transistor to a first value for a first luminance region of the display device; and
  setting, by the signal output unit, the voltage between the gate electrode of the driving transistor and the source electrode of the driving transistor to a second value for a second luminance region of the display device, wherein
    the second value is higher than the first value, and
    a luminance of the second luminance region is lower than a luminance of the first luminance region.

14. An electronic device, comprising:
a display device that includes:
  a pixel array unit that includes a plurality of pixels in a two-dimensional arrangement in a matrix,
    wherein each pixel of the plurality of pixels includes:
      a light emitting element; and a driving transistor configured to drive the light emitting element; and a signal output unit configured to:
output, to each pixel of the plurality of pixels, a signal voltage of a video signal and an initialization voltage,
wherein the initialization voltage is for initialization of a gate voltage of the driving transistor;
vary the initialization voltage based on the signal voltage of the video signal;
set a voltage between a gate electrode of the driving transistor and a source electrode of the driving transistor to a first value for a first luminance region of the display device; and
set the voltage between the gate electrode of the driving transistor and the source electrode of the driving transistor to a second value for a second luminance region of the display device, wherein the second value is higher than the first value, and a luminance of the second luminance region is lower than a luminance of the first luminance region.

* * * * *